(12) United States Patent
Fukui et al.

(10) Patent No.: US 8,608,388 B2
(45) Date of Patent: Dec. 17, 2013

(54) SEMICONDUCTOR DEVICE AND CONNECTOR

(75) Inventors: Yasuki Fukui, Osaka (JP); Kazuhito Nagura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 398 days.

(21) Appl. No.: 12/767,960

(22) Filed: Apr. 27, 2010

(65) Prior Publication Data

US 2010/0272402 A1    Oct. 28, 2010

(30) Foreign Application Priority Data

Apr. 27, 2009   (JP) .................................. 2009-108444

(51) Int. Cl.
*G02B 6/36*   (2006.01)

(52) U.S. Cl.
USPC .............................................. 385/88; 385/94

(58) Field of Classification Search
USPC ............................................................. 385/88
See application file for complete search history.

(56) References Cited

U.S. PATENT DOCUMENTS

| | | | |
|---|---|---|---|
| 2002/0118926 A1* | 8/2002 | Shimoji et al. | 385/76 |
| 2005/0184374 A1* | 8/2005 | Ohe et al. | 257/678 |
| 2006/0045434 A1 | 3/2006 | Numata | |
| 2006/0119512 A1 | 6/2006 | Yoshimatsu et al. | |
| 2007/0003194 A1* | 1/2007 | Ueno et al. | 385/92 |
| 2007/0114547 A1 | 5/2007 | Fujita et al. | |

FOREIGN PATENT DOCUMENTS

| | | |
|---|---|---|
| JP | 5-160297 A | 6/1993 |
| JP | 5-83709 U | 11/1993 |
| JP | 6-349965 A | 12/1994 |
| JP | 7-193169 A | 7/1995 |
| JP | 7-282854 A | 10/1995 |
| JP | 8-88317 A | 4/1996 |
| JP | 9-145961 A | 6/1997 |
| JP | 2000-124478 | 4/2000 |
| JP | 2000-347072 | 12/2000 |
| JP | 2002-241586 | 8/2002 |
| JP | 2005-150431 A | 6/2005 |
| JP | 2005-159265 | 6/2005 |
| JP | 2006-53266 | 2/2006 |
| JP | 2006-054259 | 2/2006 |
| JP | 2006-190972 A | 7/2006 |
| JP | 2007-94200 A | 4/2007 |
| JP | 2008-21778 A | 1/2008 |
| JP | 2009-038098 | 2/2009 |

* cited by examiner

*Primary Examiner* — Omar Rojas
(74) *Attorney, Agent, or Firm* — Nixon & Vanderhye P.C.

(57) ABSTRACT

A semiconductor device of the present invention includes: a circuit substrate; an optical semiconductor element provided on the circuit substrate; and a sealing resin provided on the circuit substrate, with which the optical semiconductor element is sealed, the sealing resin having a cuboid shape or a cubic shape, the sealing resin having an outer shape having at least one cutout part, in a case where a single cutout part is formed, the cutout part being provided in an area other than a center area of a top surface of the sealing resin, in a case where a plurality of cutout parts are provided, the cutout parts are formed so as not to be symmetric with respect to the central point on the top surface. With this arrangement, it is possible to provide a semiconductor device which can secure prevention of a sealing resin from being, in an erroneous direction, fitted into a connector.

7 Claims, 25 Drawing Sheets

F I G. 1
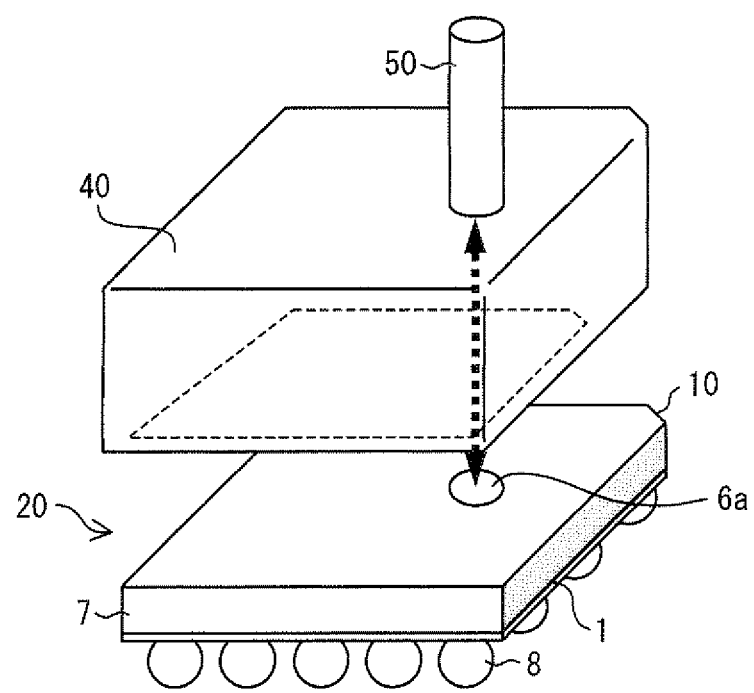

F I G. 2 (a)
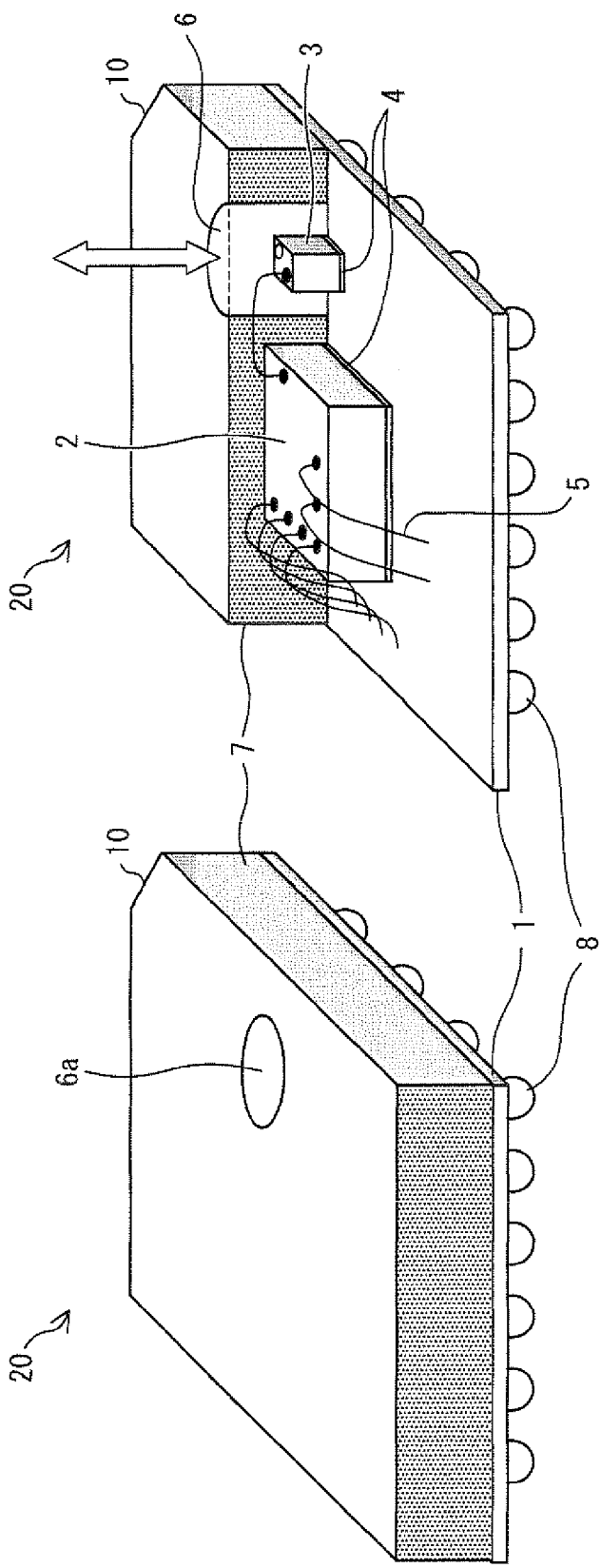
F I G. 2 (b)
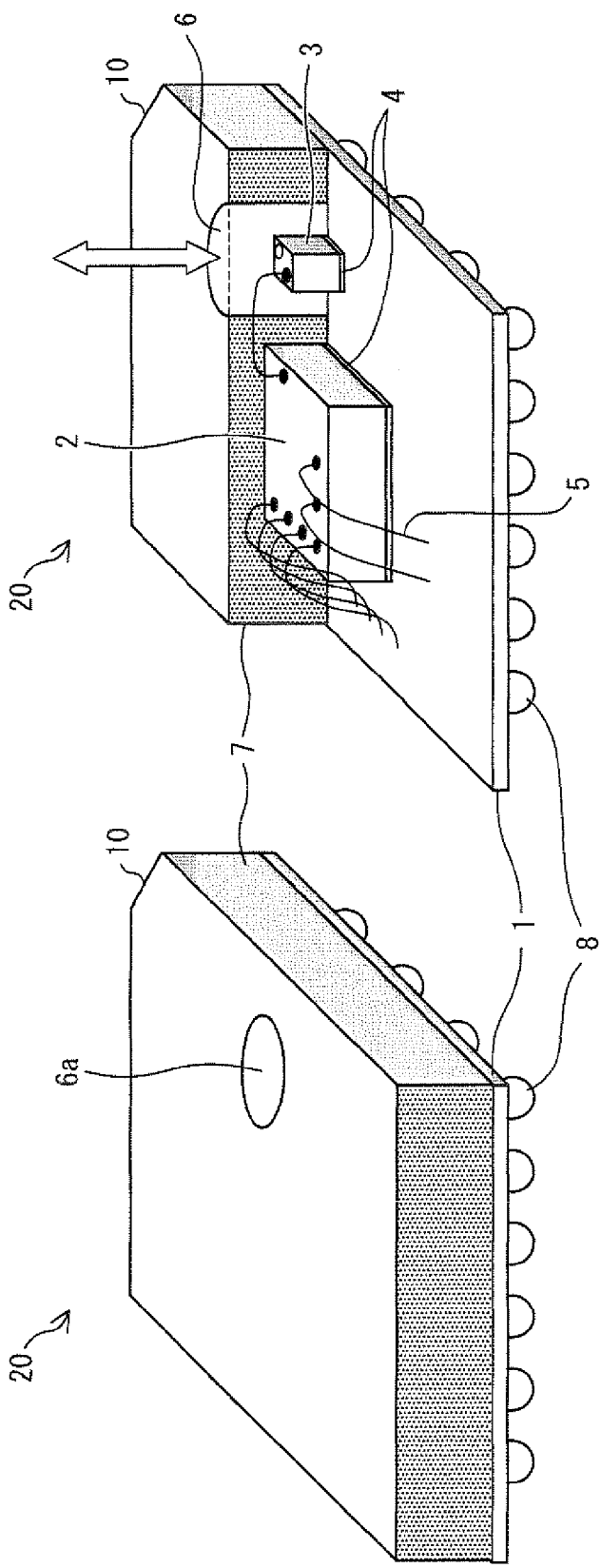

ROTATION BY 0°

PKG CAN BE FITTED INTO CONNECTOR

ROTATION BY 90°

PKG CANNOT BE FITTED INTO CONNECTOR DUE TO PHYSICAL INTERFERENCE

ROTATION BY 180°

PKG CANNOT BE FITTED INTO CONNECTOR DUE TO PHYSICAL INTERFERENCE

ROTATION BY 270°

PKG CANNOT BE FITTED INTO CONNECTOR DUE TO PHYSICAL INTERFERENCE

F I G. 4
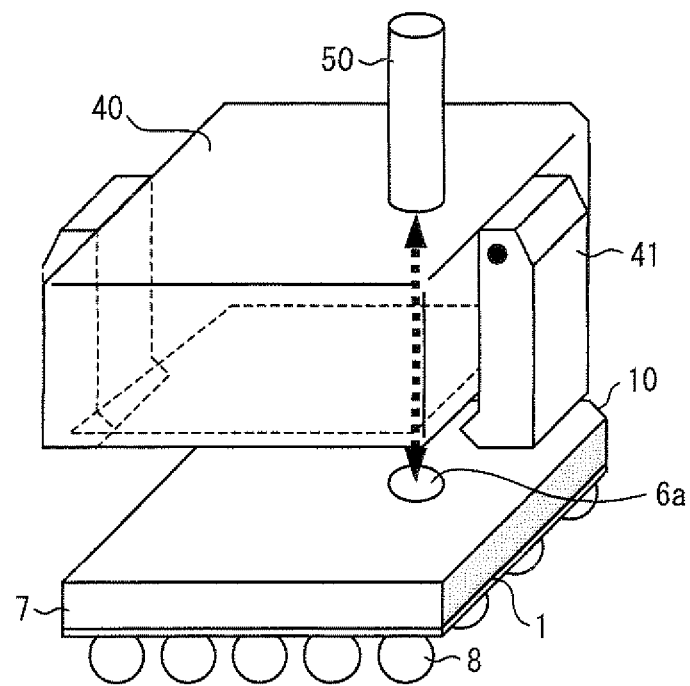

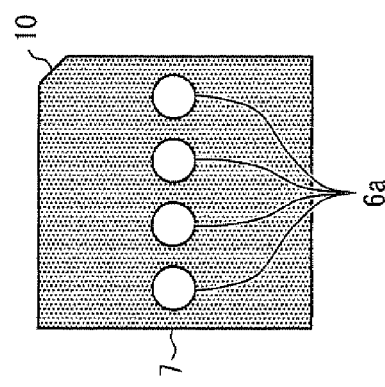
F I G. 6 ( a )
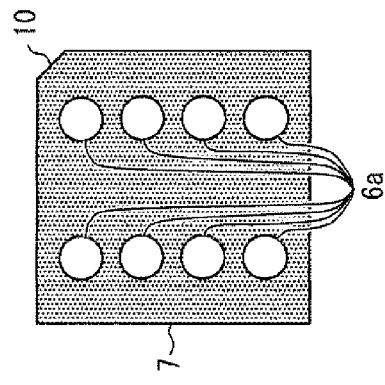
F I G. 6 ( b )
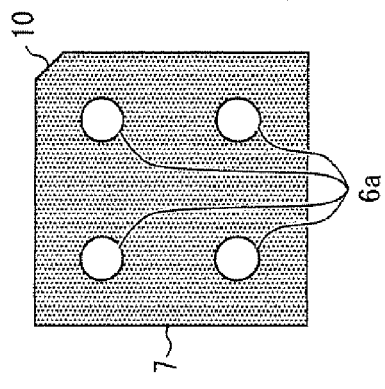
F I G. 6 ( c )
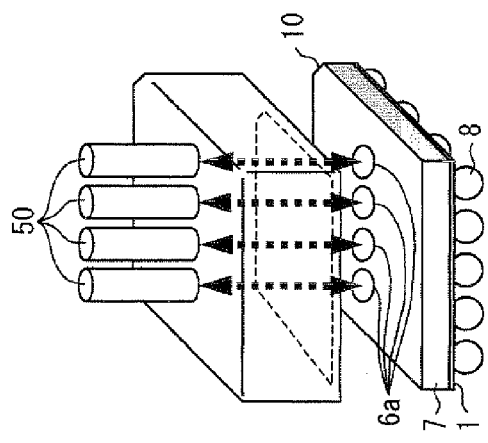
F I G. 6 ( d )
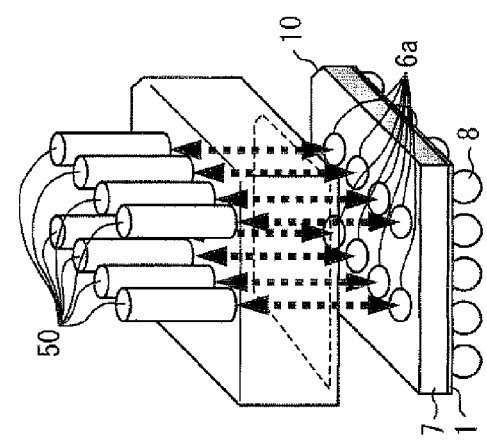
F I G. 6 ( e )
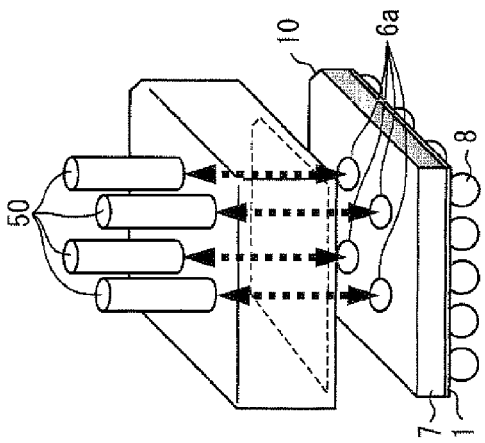
F I G. 6 ( f )

F I G. 9 (c)
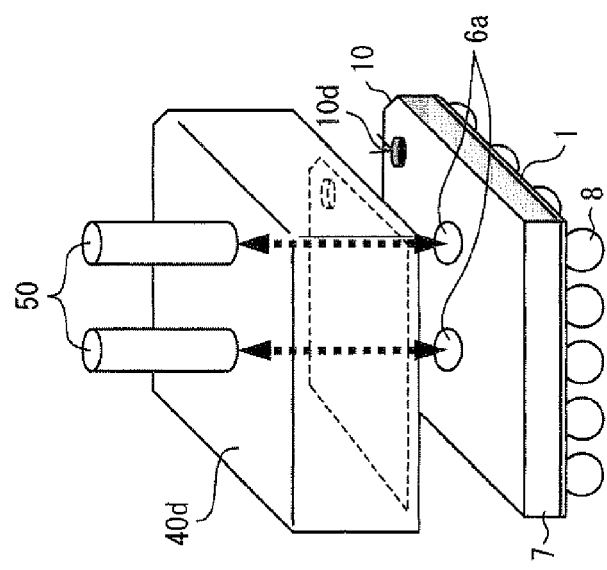
F I G. 9 (d)
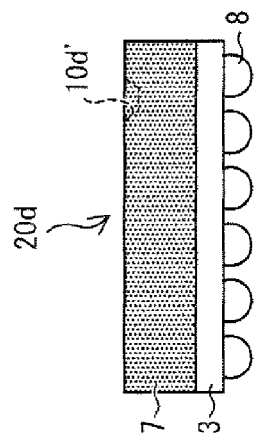
F I G. 9 (a)
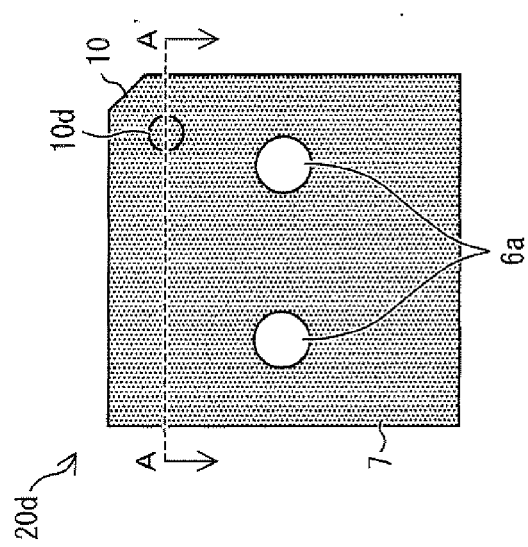
F I G. 9 (b)
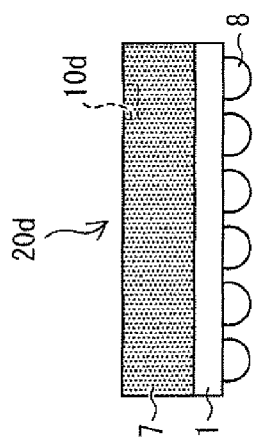

F I G. 1 1 (a)
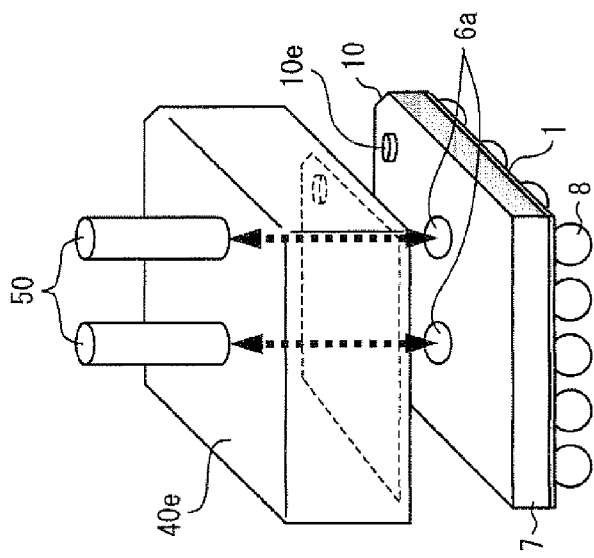
F I G. 1 1 (b)
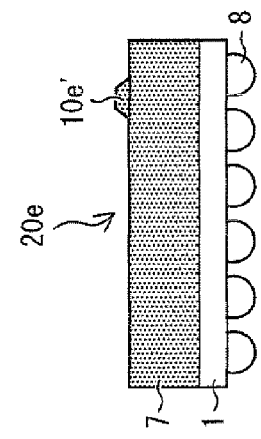
F I G. 1 1 (c)
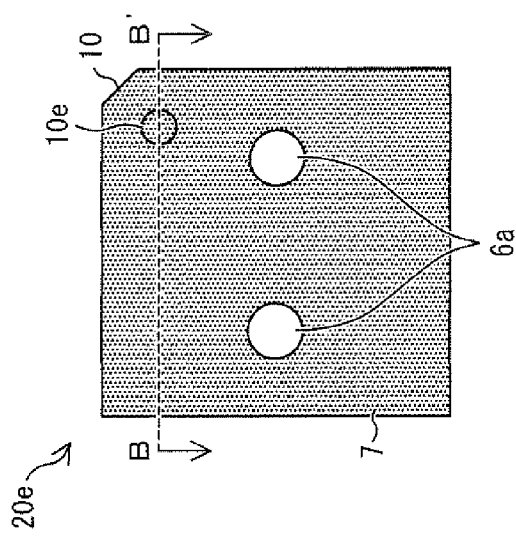
F I G. 1 1 (d)
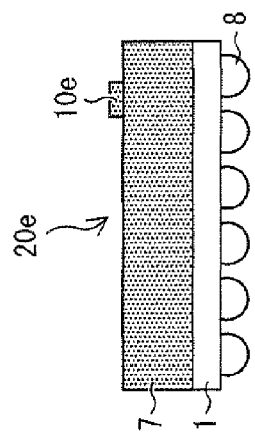

F I G. 1 2 (a)
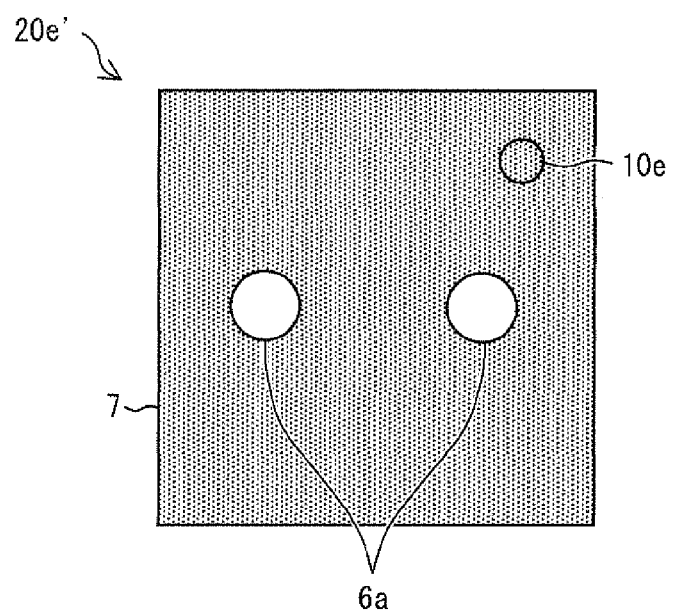
F I G. 1 2 (b)
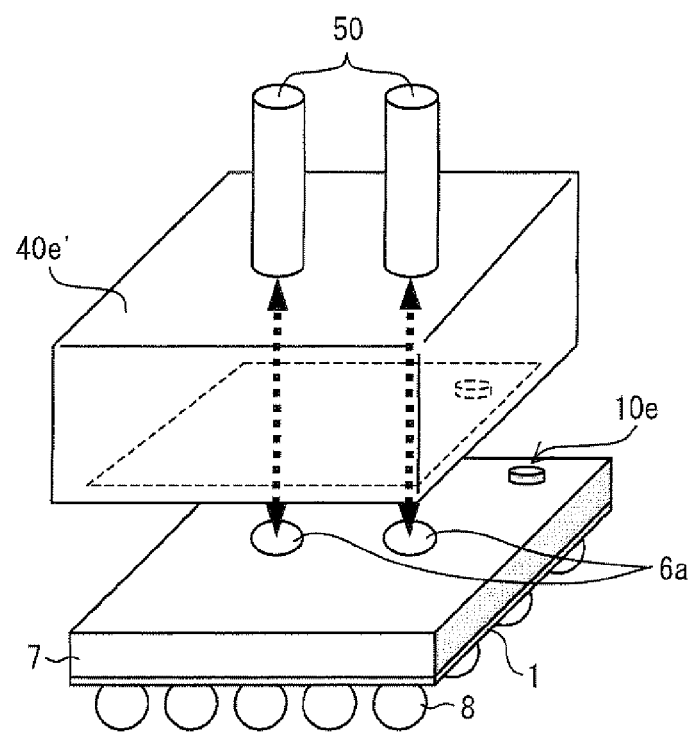

F I G. 1 3 (a)
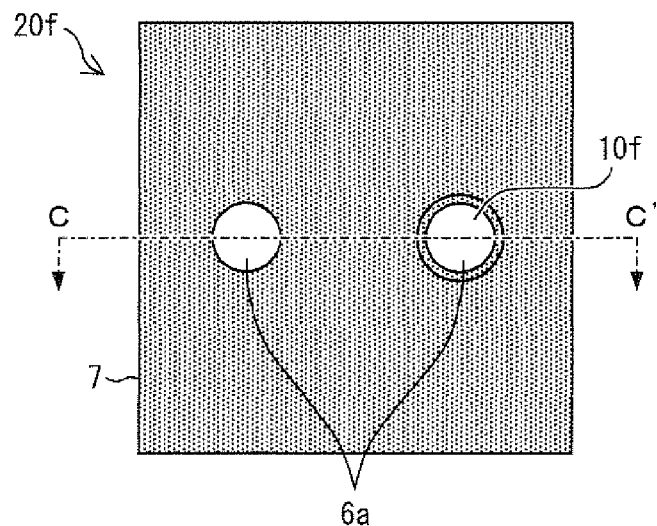
F I G. 1 3 (b)
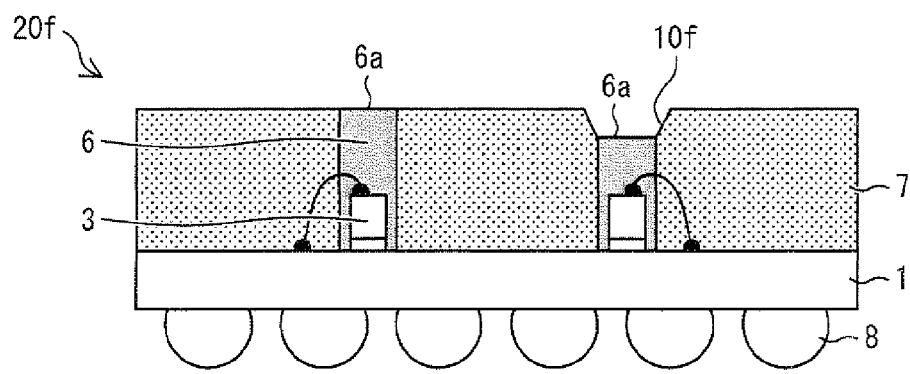
F I G. 1 3 (c)
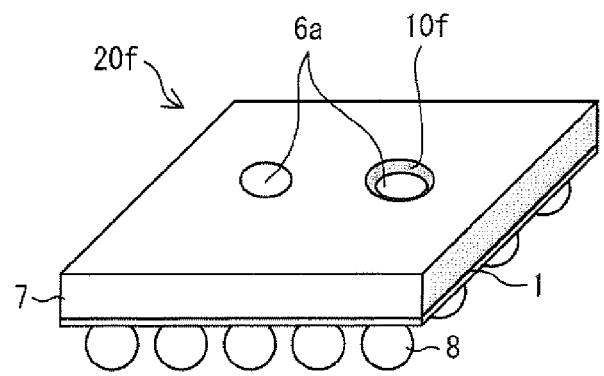

F I G. 1 4 (a)
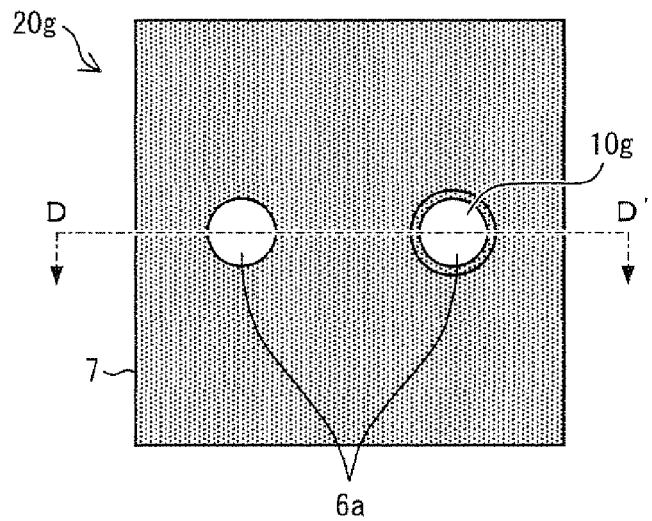
F I G. 1 4 (b)
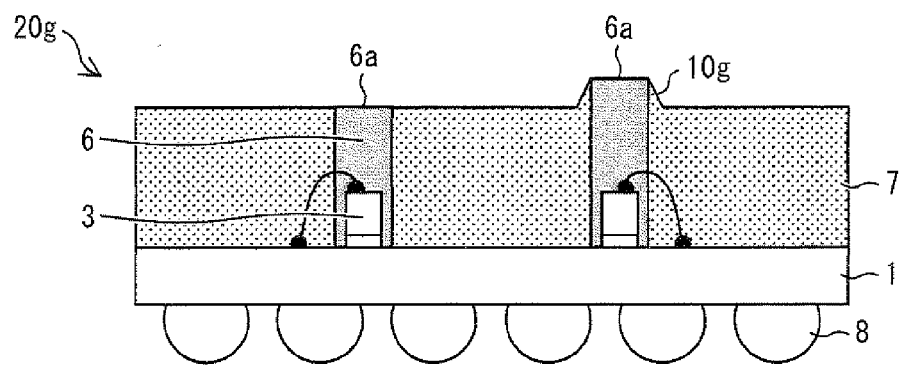
F I G. 1 4 (c)
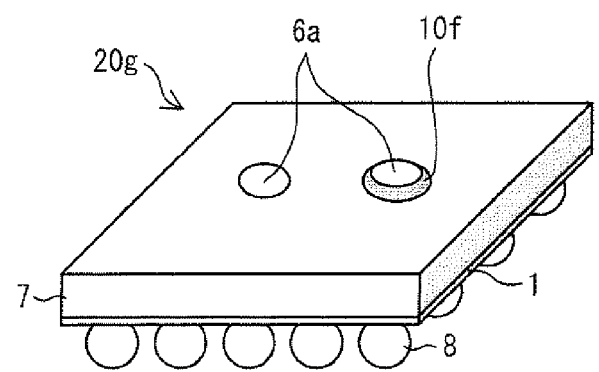

F I G. 1 8 (a)
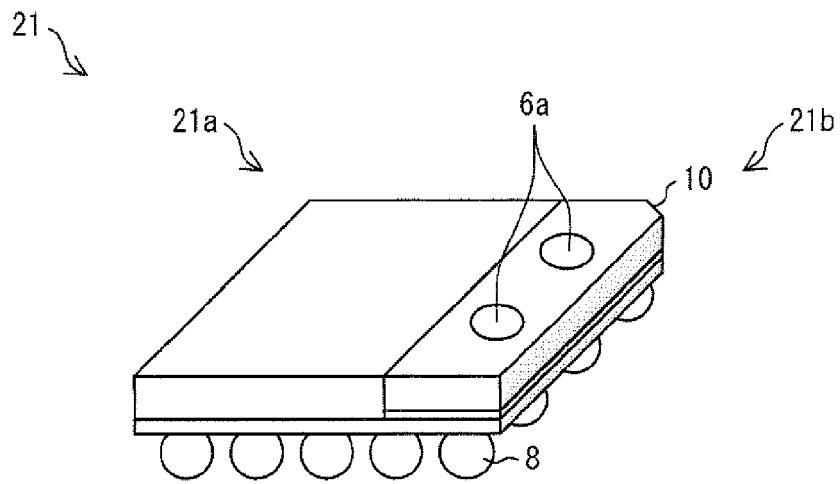
F I G. 1 8 (b)
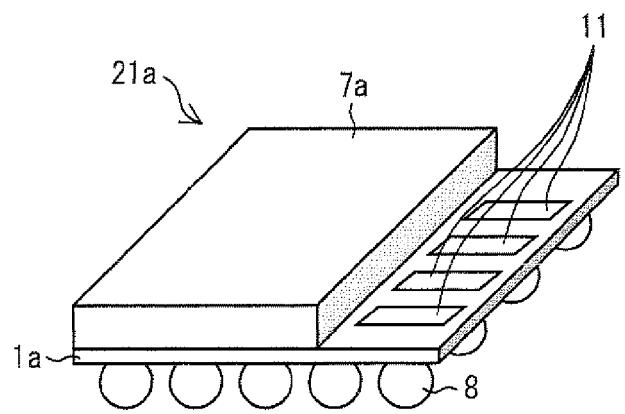
F I G. 1 8 (c)
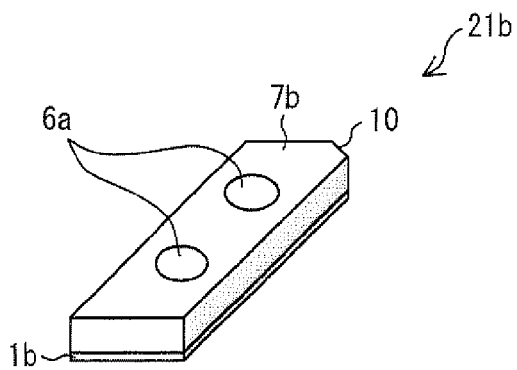

F I G. 1 9 (a)
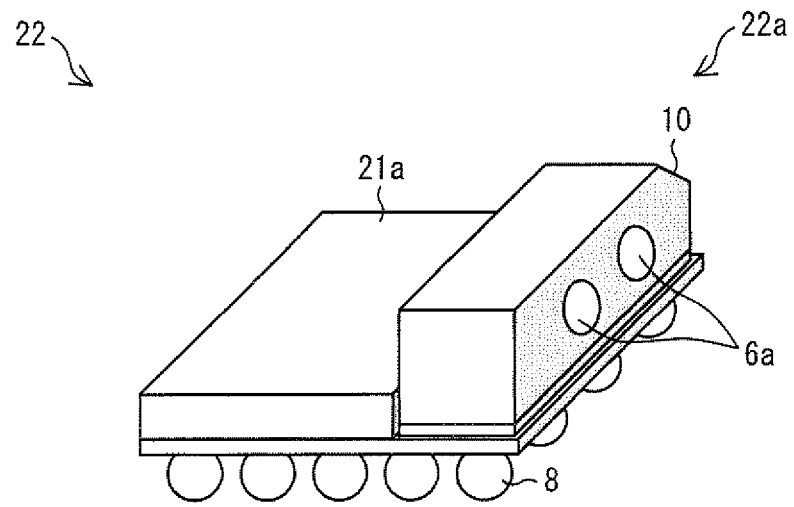
F I G. 1 9 (b)
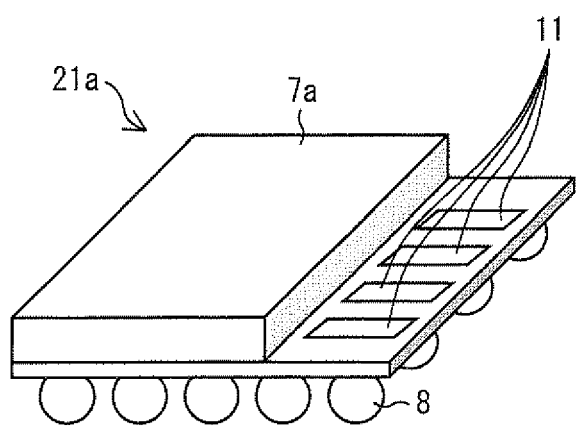
F I G. 1 9 (c)
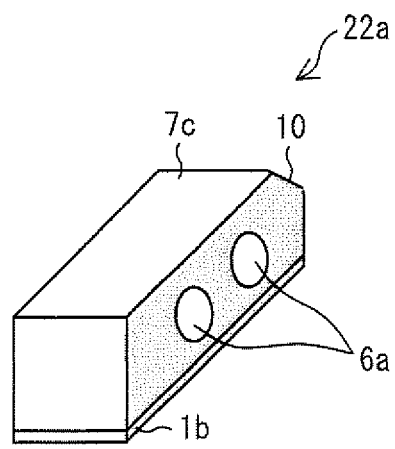

--CONVENTIONAL TECHNOLOGY--

--CONVENTIONAL TECHNOLOGY--

--CONVENTIONAL TECHNOLOGY--

F I G. 2 4
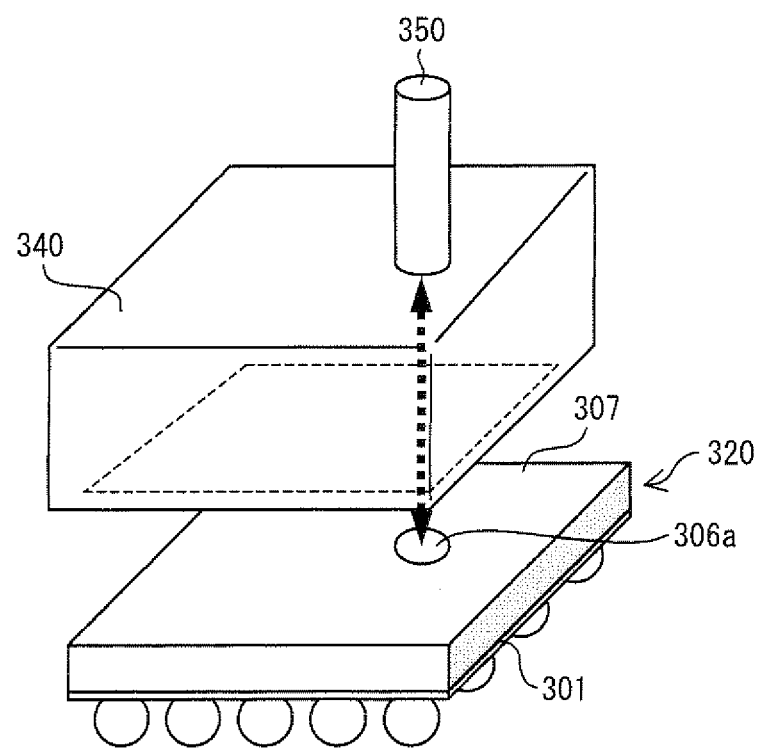

ROTATION BY 0°

ROTATION BY 90°

ROTATION BY 180°

ROTATION BY 270°

SEMICONDUCTOR DEVICE AND CONNECTOR

This Nonprovisional application claims priority under 35 U.S.C. §119(a) on Patent Application No. 2009-108444 filed in Japan on Apr. 27, 2009, the entire contents of which are hereby incorporated by reference.

TECHNICAL FIELD

The present invention relates to a semiconductor device, and particularly relates to a semiconductor device connected to an optical fiber.

BACKGROUND ART

In recent years, in a field of a semiconductor device, there have been (i) an improvement in performance of each of various semiconductor elements and (ii) developments of a high-speed data transmission technology. This allows a dramatic improvement in operation speed of a large-scale integrated circuit (LSI). However, a problem is still unsolved that, in spite of the speed-up of internal operations of the LSI, a print substrate on which the LSI is provided has at least the following problems due to an increase in operation frequency: (i) an increase in transmission loss occurred in electric wiring; (ii) an increase in noise, and (iii) an increase in electromagnetic block. This made it significantly difficult to transmit, without any problems, a signal having an operation frequency of greater than 1 GHz on the print substrate which requires complicated wiring. Therefore, for the purpose of ensuring signal quality, it has been necessary to take a measure (i) to limit a wiring design in view of the operation frequency, (ii) to keep the operation frequency low, and/or the like. Thus, it has been impossible to fully bring out the inherent performance of the LSI.

In view of the problems of the semiconductor device, it has recently been considered and put into practical use to apply an optical interconnection technology for connecting the LSI with the use of an optical fiber. According to the optical interconnection technology, in general, (i) an electric signal is converted into an optical signal, (ii) the optical signal thus obtained is transmitted via an optical fiber, and then (iii) the optical signal thus transmitted is converted into an electric signal. The conversion of the electric signal into the optical signal and vice versa are carried out by an optical semiconductor element. Accordingly, the optical semiconductor element and the optical fiber should be connected to each other in the semiconductor device, while their positioning is being secured. For example, Patent Literatures 1 through 3 disclose various optical semiconductor modules and semiconductor devices each of which secures positioning of the optical semiconductor element and the optical fiber.

Each of Patent Literatures 1 and 2 discloses an optical module in which the optical fiber and the optical semiconductor element are integral with each other. FIG. 22 is a cross-sectional view illustrating an arrangement disclosed in Patent Literature 1 in which the optical module is connected to a semiconductor device 120. As illustrated in FIG. 22, the semiconductor device 120 disclosed in Patent Literature 1 has an arrangement in which a semiconductor element 102 and an optical module 110 are connected to each other via a wire 105, and the optical module 110 and the wire 105 are partially covered by a sealing portion 107. According to the optical module 110, an optical semiconductor element 103 is fixed, via a conductive layer 106, to a support portion 104 provided on a peripheral surface of the optical fiber 130. This arrangement secures the positioning of the optical semiconductor element 103 and the optical fiber 130, and realizes a semiconductor device that is easy to manufacture. Patent Literature 2 also discloses an optical module similar to the optical module 110 disclosed in Patent Literature 1.

Further, Patent Literature 3 discloses an optical semiconductor module in which an optical fiber and an optical semiconductor element are provided separable from each other. FIG. 23(a) is a cross-sectional view illustrating an arrangement of an optical semiconductor module 210 disclosed in Patent Literature 3, and FIG. 23(b) is a cross-sectional view illustrating an arrangement of a semiconductor device 260 including the optical semiconductor module 210. As illustrated in FIG. 23(a), the optical semiconductor module 210 disclosed in Patent Literature 3 includes a guide 212. The guide 212 has: a positioning through-hole 211 for an optical transmission path; an optical semiconductor receiving surface 212a that is one end surface of the optical transmission path located in the positioning through-hole 211, which one end surface is exposed in the positioning through-hole 211; and a wiring layer 208 provided on the optical semiconductor receiving surface 212a. Further, the optical semiconductor receiving surface 212a of the guide 212 is provided with an optical semiconductor element 203 so that a light emitting surface or a light receiving surface of the optical semiconductor element 203 faces the one end surface of the optical transmission path. This causes the optical semiconductor element 203 to be electrically connected to the wiring layer 208. Furthermore, a driving semiconductor element 213 for driving the optical semiconductor element 203 is provided adjacent to the optical semiconductor element 203 so as to be provided inside the optical semiconductor module 210. According to the optical semiconductor module 210, the optical fiber is inserted in the positioning through-hole 211, so as to (i) secure the positioning of the optical semiconductor element 203 and an optical fiber 250, (ii) reduce the size of the optical semiconductor module 210, and (iii) reduce cost.

Further, as illustrated in FIG. 23(b), the semiconductor device 260 includes a signal processing LSI 202 which is connected via bumps, by flip chip bonding, onto a substrate 201 having high-speed signal wiring. Moreover, the substrate 201 provided with the signal processing LSI 202 is further provided with two optical semiconductor modules 210. According to the semiconductor device 260, it is possible to (i) secure the positioning of the optical semiconductor element 203 and the optical fiber 250 and (ii) realize, at low cost, such a wiring structure in which optical wiring is applied to LSI wiring.

Citation List

Patent Literature 1

Japanese Patent Application Publication, Tokukai, No. 2000-347072 A (Publication Date: Dec. 15, 2000)

Patent Literature 2

Japanese Patent Application Publication, Tokukai, No. 2006-054259 A (Publication Date: Feb. 23, 2006)

Patent Literature 3

Japanese Patent Application Publication, No. 2006-053266 (Feb. 23, 2006)

SUMMARY OF INVENTION

Technical Problem

However, according to each of the optical semiconductor devices disclosed in respective Patent Literatures 1 and 2, the optical fiber and the optical semiconductor element are integral with each other. As such, it is necessary, in a case where the optical semiconductor device is sealed with a resin, that the optical semiconductor device is sealed with a resin, while the optical fiber is being connected to the optical semiconductor device. This causes the following problems. Specifically, in a case where the semiconductor device is subjected to a finite shape sealing, it would be difficult to carry out a finite shape treatment with respect to an optical fiber part. In a case where the semiconductor device is subjected to nonfinite shape sealing, the optical semiconductor device would have a shape difficult to handle. Further, since the optical semiconductor element which is integral with the optical fiber is poor in physical area, the number of external electrode terminals which can be provided is limited. Therefore, in a case where a high-speed serial signal is transmitted or received, a serializer member and a deserializer member would, be required separately. Because of this, it is impossible to realize a downsized system. Further, according to the optical semiconductor device in which the optical fiber and the optical semiconductor element are connected to each other all the time, it is significantly inconvenient in processes such as shipment, packaging, mounting process carried out by a user himself or herself, and handling. As such, a problem will occur that it would be impossible to merely replace the optical fiber with another optical fiber solely in a case of a wiring trouble.

Furthermore, according to the semiconductor device disclosed in Patent Literature 3, the optical fiber is connected to the optical semiconductor element while being inserted in the positioning through-hole. This will cause a problem of reducing connection reliability. Moreover, the provision of the external electrode terminals of the optical semiconductor element is limited on a sealing side of the semiconductor device, not on a surface of the optical transmission path. Because of the arrangement, it is impossible to provide a large number of the external electrode terminals. Therefore, in a case where a high-speed serial signal is transmitted or received, a serializer member and a deserializer member would be additionally required, and so it is not possible to reduce the size of the entire system. This is similar to the semiconductor devices disclosed in Patent Literature 1 and 2. Further, in a case where the optical semiconductor device is sealed with a resin, the sealing should be carried out after the optical semiconductor element and the optical fiber are connected to each other. This causes the optical fiber to be to fixed by the resin. It follows that the semiconductor device disclosed in Patent Literature 3 has the same problems as the optical semiconductor devices disclosed in Patent Literatures 1 and 2.

In order to solve the problems related to the connection between such a conventional semiconductor device and the optical fiber, an arrangement illustrated in FIG. 24 can be contrived. In FIG. 24, an optical semiconductor element (not illustrated) is provided on a circuit substrate 301 of a semiconductor device 320, and is sealed with a sealing resin 307 having a square shape. The sealing resin 307 is provided such that (i) its region in which the optical semiconductor element is provided is made from a transparent resin, and (ii) the transparent resin is exposed in an upper surface of the sealing resin 307 so as to provide an optical interface 306*a*. Further, an end of the optical fiber 350 is provided with a connector 340, and the connector 340 has an inner surface shape which extends in accordance with an outer surface of the sealing resin 307. When the semiconductor device 320 and the optical fiber 350 are connected to each other, the sealing resin 307 is fitted into the connector 340 so that the end of the optical fiber 350 and the optical interface 306*a* face each other. Therefore, it becomes possible to realize a connection of the semiconductor device and the optical fiber in which connection (i) manufacture, handling, maintenance and downsizing can be easily realized and (ii) the optical wiring is attachable and detachable to and from the semiconductor device even after the resin sealing is carried out. Note that the structure illustrated in FIG. 24 was not publicly known at the time of the filing of the subject patent application.

However, the arrangement illustrated in FIG. 24 newly causes another problem described below. FIG. 25 is a plan view illustrating directions in which the sealing resin 307 of the semiconductor device 320 is fitted into the connector 340 illustrated in FIG. 24. A single-sided sealed semiconductor device, such as a BGA or a CSP, generally has a square or rectangular shape when it is being viewed in a direction perpendicular to a top surface of the semiconductor device. Therefore, for example, the semiconductor device 320 having a square package contour has rotational symmetries of 0°, 90°, 180°, and 270°, as illustrated in FIG. 25(*a*) through FIG. 25(*d*). Accordingly, in a case where each of a top surface of the semiconductor device 320 and a top surface of the connector 340 into which the sealing resin 307 of the semiconductor device 320 is to be fitted has a square shape, the sealing resin 307 of the semiconductor device 320 can be fitted into the connector 340 at any of four rotational angles of 0°, 90°, 180°, and 270°. On the other hand, in a case where the optical interface 306*a* is not positioned at the center of rotation of the package contour of the semiconductor device 320 (see FIG. 25(*a*) through FIG. 25(*d*)), the optical interface 306*a* would not have the rotational symmetry. Therefore, there is a risk that the sealing resin 307 of the semiconductor device 320 might be fitted into the connector 340 while the optical interface 306*a* and the end of the optical fiber 350 are not facing each other (see FIG. 25(*b*) through FIG. 25(*d*)).

While the optical interface 306*a* and the optical fiber 350 are not facing each other, it is impossible to transmit an optical signal between the optical semiconductor element and the optical fiber 350. Therefore, it is necessary to fit the connector 340 into the sealing resin 307 of the semiconductor device 320 while the optical interface 306*a* and the optical fiber 350 are facing each other (see FIG. 25(*a*)). In view of the circumstances, it is necessary to carry out an acknowledging action in which (i) each of the semiconductor device 320 and the connector 340 is provided with a sign or a mark for indicating a correct direction in which the sealing resin 307 should be fitted into the connector 340, and then (ii) the sealing resin 307 is fitted into the connector 340 after the marks or signs are visually confirmed. However, with such an acknowledging action in which the signs or the marks are visually confirmed, it is highly probable that the sealing resin 307 is erroneously fitted into the connector 340 due to an error caused by an operator's oversight. This may cause a problem that such a human error cannot be found until the last step.

The present invention is made in view of the problem. An object of the present invention is to provide a semiconductor device which can secure the prevention of a sealing resin from being, in an erroneous direction, fitted into a connector.

Solution to Problem

In order to attain the object, a semiconductor device includes: a circuit substrate; a semiconductor element provided on the circuit substrate; and a sealing resin, provided on the circuit substrate, with which the semiconductor element is sealed, the sealing resin having a cuboid shape or a cubic shape, the sealing resin having an outer surface, the outer surface having at least one deformed part, in a case where said at least one deformed part is a single deformed part provided in the outer surface, the single deformed part being provided in an area other than a center area of the outer surface of the sealing resin, and in a case where said at least one deformed part is a plurality of deformed parts provided in the outer surface, the plurality of deformed parts being provided so as not to be symmetric with respect to a central point on the outer surface.

According to the invention described above, in the case where a single deformed part is provided, the single deformed part is provided in an area other than the center area of the outer surface of the sealing resin having the cuboid or cubic shape. Further, in the case where the plurality of deformed parts are provided, the plurality of deformed parts are provided so as not to be symmetric with each other with respect to a central point on the outer surface of the sealing resin. It follows that the outer shape of the sealing resin having the deformed part has no rotational symmetry.

Therefore, in a ease where a connector into which the outer surface of the sealing resin is fitted has an inner surface shape which extends in accordance with the outer shape of the sealing resin having the deformed part, the sealing resin can be fitted into the connector only when they are arranged in a certain direction. This can secure prevention of the semiconductor device from being, in an erroneous direction, fitted into the connector.

Advantageous Effects of Invention

As described above, the semiconductor device of the present invention includes the sealing resin having the outer surface having at least one deformed part, in a case where a single deformed part is provided, the deformed part being provided in an area other than the center area of the outer surface, in a case where a plurality of deformed parts are provided, the plurality of deformed parts being provided so as not to be symmetric with respect to the central point of the outer surface.

Therefore, with the present invention, it is possible to provide a semiconductor device which can secure the prevention of a sealing resin from being, in an erroneous direction, fitted into a connector.

BRIEF DESCRIPTION OF DRAWINGS

FIG. 1

FIG. 1 is a perspective view illustrating a connection between a semiconductor device in accordance with Embodiment 1 and an optical fiber.

FIG. 2(a)

FIG. 2(a) is a perspective view illustrating the semiconductor device illustrated in FIG. 1.

FIG. 2(b)

FIG. 2(b) is a perspective view illustrating an internal structure of a sealing resin, illustrated in FIG. 2(a), provided on the semiconductor device.

FIG. 3(a) is a plan view indicating a direction in which the sealing resin of the semiconductor device illustrated in FIG. 1 is fitted into a connector.

FIG. 3(b) is a plan view indicating a direction in which the sealing resin of the semiconductor device illustrated in FIG. 1 cannot be fitted into the connector.

FIG. 3(c) is a plan view indicating a direction in which the sealing resin of the semiconductor device illustrated in FIG. 1 cannot be fitted into the connector.

FIG. 3(d) is a plan view indicating a direction in which the sealing resin of the semiconductor device illustrated in FIG. 1 cannot be fitted into the connector.

FIG. 4

FIG. 4 is a perspective view illustrating a modified example of the connection between the semiconductor device illustrated in FIG. 1 and the optical fiber.

FIG. 5(a) is a plan view of a modified example of Embodiment 1, illustrating a semiconductor device having two optical interfaces.

FIG. 5(b) is a perspective view illustrating a connection between the semiconductor device illustrated in FIG. 5(a) and optical fibers.

FIG. 6(a)

FIG. 6(a) is a plan view illustrating an arrangement in which optical interfaces are provided in area alignment.

FIG. 6(b)

FIG. 6(b) is a plan view illustrating an arrangement in which optical interfaces are provided in linear alignment.

FIG. 6(c)

FIG. 6(c) is a plan view illustrating an arrangement in which optical interfaces are provided in linear alignment.

FIG. 6(d)

FIG. 6(d) is a perspective view illustrating a connection between the semiconductor devices illustrated in FIG. 6(a) and optical fibers.

FIG. 6(e)

FIG. 6(e) is a perspective view illustrating a connection between the semiconductor devices illustrated in FIG. 6(b) and optical fibers.

FIG. 6(f)

FIG. 6(f) is a perspective view illustrating a connection between the semiconductor devices illustrated in FIG. 6(c) and optical fibers.

FIG. 7(a) is a plan view illustrating a semiconductor device in accordance with another modified example of Embodiment 1.

FIG. 7(b) is a perspective view illustrating a connection between the semiconductor device illustrated in FIG. 7(a) and an optical fiber.

FIG. 8(a) is a plan view illustrating a semiconductor device in accordance with still another modified example of Embodiment 1.

FIG. 8(b) is a perspective view illustrating a connection between the semiconductor device illustrated in FIG. 8(a) and optical fibers.

FIG. 9(a)

FIG. 9(a) is a plan view illustrating a semiconductor device in accordance with another modified example of Embodiment 1.

FIG. 9(b)

FIG. 9(b) is a cross-sectional view of the semiconductor device illustrated in FIG. 9(a), taken along a line A-A'.

FIG. 9(c)

FIG. 9(c) is a perspective view illustrating a connection between the semiconductor device illustrated in FIG. 9(a) and optical fibers.

FIG. 9(d)

FIG. 9(d) is a cross-sectional view illustrating such an arrangement that a concave part of the semiconductor device illustrated in FIG. 9(b) is modified.

FIG. 10(a) is a plan view illustrating a modified example of the semiconductor device illustrated in FIG. 9(a).

FIG. 10(b) is a perspective view illustrating a connection between the semiconductor device illustrated in FIG. 10(a) and optical fibers.

FIG. 11(a)

FIG. 11(a) is a plan view illustrating a semiconductor device in accordance with still another modified example of Embodiment 1.

FIG. 11(b)

FIG. 11(b) is a cross-sectional view illustrating the semiconductor device illustrated in FIG. 11(a), taken along a line B-B'.

FIG. 11(c)

FIG. 11(c) is a perspective view illustrating a connection between the semiconductor device illustrated in FIG. 11(a) and optical fibers.

FIG. 11(d)

FIG. 11(d) is a cross-sectional view illustrating such an arrangement that a protrusion part of the semiconductor device illustrated in FIG. 11(b) is deformed.

FIG. 12(a)

FIG. 12(a) is a plan view illustrating a modified example of the semiconductor device illustrated in FIG. 11(a).

FIG. 12(b)

FIG. 12(b) is a perspective view illustrating a connection between the semiconductor device illustrated in FIG. 12(a) and optical fibers.

FIG. 13(a)

FIG. 13(a) is a plan view illustrating a semiconductor device in accordance with still another modified example of Embodiment 1.

FIG. 13(b)

FIG. 13(b) is a cross-sectional view illustrating the semiconductor device illustrated in FIG. 13(a), taken along a line C-C'.

FIG. 13(c)

FIG. 13(c) is a perspective view illustrating the semiconductor device illustrated in FIG. 13(a).

FIG. 14(a)

FIG. 14(a) is a plan view illustrating a semiconductor device in accordance with still another modified example of Embodiment 1.

FIG. 14(b)

FIG. 14(b) is a cross-sectional view illustrating the semiconductor device illustrated in FIG. 14(a).

FIG. 14(c)

FIG. 14(c) is a perspective view illustrating the semiconductor device illustrated in FIG. 14(a).

FIG. 15(a) is a side view illustrating a semiconductor device in accordance with still another modified example of Embodiment 1.

FIG. 15(b) is a perspective view illustrating a connection between the semiconductor device illustrated in FIG. 15(a) and an optical fiber.

FIG. 16(a) is a side view illustrating a semiconductor device in accordance with still another modified example of Embodiment 1.

FIG. 16(b) is a perspective view illustrating a connection between the semiconductor device illustrated in FIG. 16(a) and an optical fiber.

FIG. 17(a) is a perspective view illustrating a semiconductor device in accordance with Embodiment 2.

FIG. 17(b) is a cross-sectional view illustrating the semiconductor device, taken along a line E-E'.

FIG. 17(c) is a cross-sectional view illustrating such an arrangement that an interposer chip is provided between a semiconductor element and an optical semiconductor in the semiconductor device illustrated in FIG. 17(b).

FIG. 18(a)

FIG. 18(a) is a perspective view illustrating a semiconductor device in accordance with Embodiment 3.

FIG. 18(b)

FIG. 18(b) is a perspective view illustrating a part of the semiconductor device illustrated in FIG. 18(a).

FIG. 18(c)

FIG. 18(c) is a perspective view illustrating a part of the semiconductor device illustrated in FIG. 18(a).

FIG. 19(a)

FIG. 19(a) is a perspective views illustrating a modified example of the semiconductor device in accordance with Embodiment 3.

FIG. 19(b)

FIG. 19(b) is a perspective view illustrating a part of the semiconductor device illustrated in FIG. 19(a).

FIG. 19(c)

FIG. 19(c) is a perspective view illustrating a part of the semiconductor device illustrated, in FIG. 19(a).

FIG. 20 is a block diagram illustrating an arrangement of a liquid crystal display device in accordance with Embodiment 3.

FIG. 21(a) is a perspective view illustrating an arrangement in which the liquid crystal display device illustrated in FIG. 20 is realized with the use of optical fibers.

FIG. 21(b) is a perspective view illustrating an arrangement in which the liquid crystal display device illustrated in FIG. 20 is provided with optical waveguide forming wires.

FIG. 22 is a cross-sectional view illustrating an arrangement of a conventional semiconductor device.

FIG. 23(a) is a cross-sectional view illustrating an arrangement of another conventional optical semiconductor module.

FIG. 23(b) is a cross-sectional view illustrating an arrangement of a semiconductor device including the optical semiconductor module illustrated in FIG. 23(a).

FIG. 24

FIG. 24 is a perspective view illustrating a connection between a semiconductor device and an optical fiber.

FIG. 25(a) is a plan view indicating a direction in which the semiconductor device illustrated in FIG. 24 is fitted into a connector.

FIG. 25(b) is a plan view indicating a direction in which the semiconductor device illustrated in FIG. 24 is fitted into a connector.

FIG. 25(c)

Figure 25A:
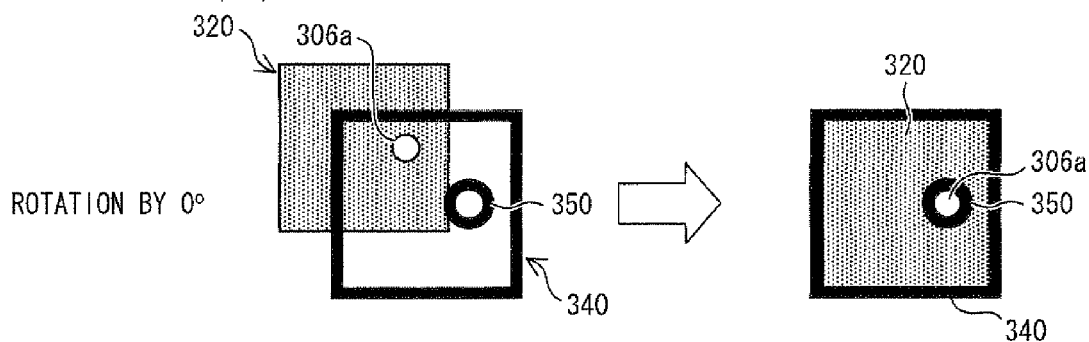
FIG. 25(a)
Figure 25B:
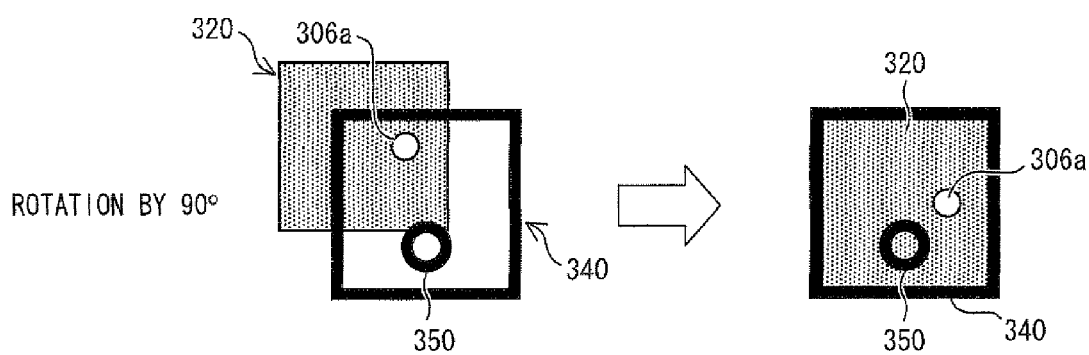
FIG. 25(b)
Figure 25C:
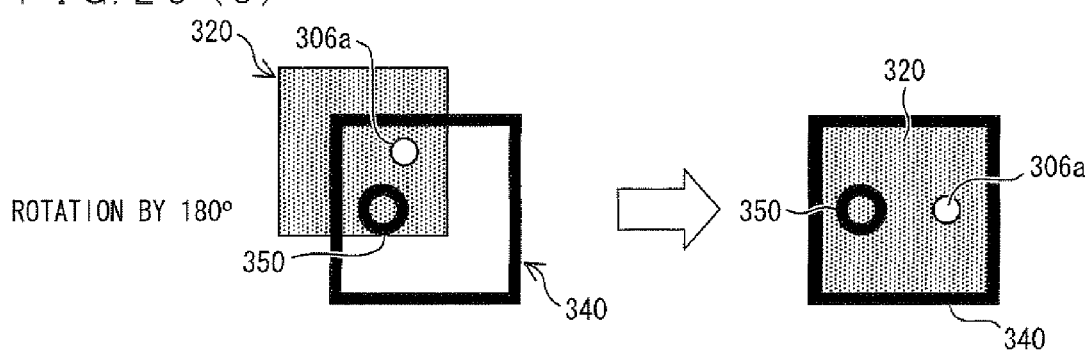

FIG. 25(c) is a plan view indicating a direction in which the semiconductor device illustrated in FIG. 24 is fitted into a connector.

FIG. 25(d)

Figure 25D:
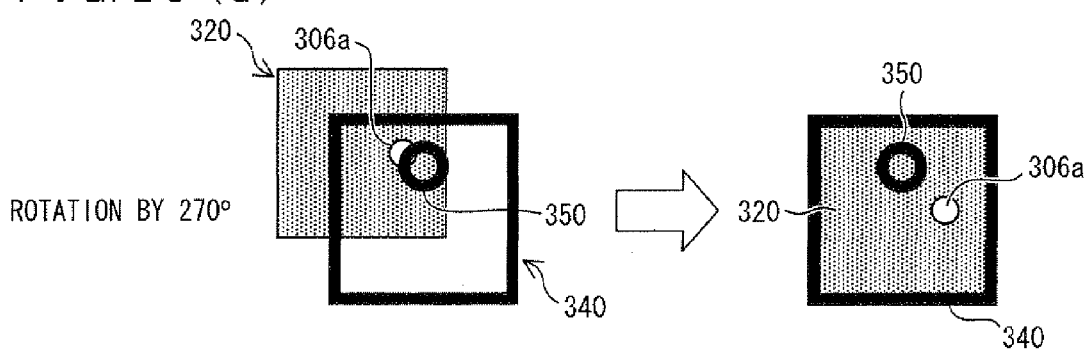

FIG. 25(d) is a plan view indicating a direction in which the semiconductor device illustrated in FIG. 24 is fitted into a connector.

DESCRIPTION OF EMBODIMENTS

[Embodiment 1]

The first embodiment of the present invention is specifically described below with reference to FIGS. 1 through 14. The following description discusses an embodiment in which an optical fiber is connected to a semiconductor device having an optical semiconductor element on a circuit substrate.

FIG. 1 is a perspective view illustrating a connection between a semiconductor device 20 of the present embodiment and an optical fiber 50. Further, FIG. 2(a) is a perspective view illustrating the semiconductor device 20 of the present embodiment, and FIG. 2(b) is a perspective view illustrating an internal arrangement of a sealing resin provided in the semiconductor device 20. First, the following description deals with an arrangement of the semiconductor device 20 of the present embodiment with reference to FIGS. 2(a) and 2(b).

As illustrated in FIG. 2(a), the semiconductor device 20 has an arrangement in which a sealing resin 7 is provided on a surface of a circuit substrate 1 so as to have a cuboid shape, and external electrode terminals 8 are provided on a back surface of the circuit substrate 1. Further, as illustrated in FIG. 2(b), a semiconductor element 2 and an optical semiconductor element 3 are provided on the circuit substrate 1. The circuit substrate 1 can be an organic insulating substrate made of a material such as glass epoxy, a BT resin, and a polyimide. Further, a wiring layer (not illustrated) is provided either on one of the two surfaces of the circuit substrate 1 or on each of the two surfaces of the circuit substrate 1. In the latter case, the wiring layers are connected to each other via a through-hole (not illustrated) or the like. The wiring layer can be formed on the surface of the circuit substrate 1 by carrying out patterning of copper wiring or by using a metallic lead frame or the like. An insulating layer (not illustrated), with which the wiring layer on the circuit substrate 1 is coated, is generally formed by use of a solder mask. Note however that a material of the insulating layer is not particularly limited. A sort of the semiconductor element 2 is not particularly limited, and any sort of semiconductor element can be used in the present embodiment.

The optical semiconductor element 3 can be either a light-emitting semiconductor element or a light receiving semiconductor element. The light emitting semiconductor element can be an LED or the like, for example. Further, the light receiving semiconductor element can be a VCSEL chip, a photodiode, or the like, for example.

Each of the semiconductor element 2 and the optical semiconductor element 3 is fixed onto the circuit substrate 1 via an adhesion layer 4. A sort of the adhesion layer 4, and a way to provide the adhesion layer 4 are not particularly limited. The adhesion layer 4 can be an adhesive of any type, such as a solid type, or a liquid type. For example, the adhesion layer 4 can be a paste adhesive, a sheet adhesive, an anisotropic conductive film, or the like.

Further, as illustrated in FIG. 2(b), the semiconductor element 2 and the optical semiconductor element 3 are electrically connected to the wiring layer of the circuit substrate 1 via bonding wires 5. The bonding wire 5 can be made from a conductive material such as a metal. According to the semiconductor device 20 of the present embodiment, a wire bonding method is adopted. Note however that a way to electrically connect the semiconductor element 2 and the optical semiconductor element 3 to the circuit substrate 1 is not particularly limited. For example, it is possible to adopt a flip-chip bonding method in which the semiconductor element 2 is mounted with its face down so as to be directly connected to the circuit substrate 1 via a metallic bump or the like.

Further, the semiconductor device 20 is provided with the external electrode terminals 8 on a surface of the circuit substrate 1, which surface is opposite to the surface on which the semiconductor element 2 of the circuit substrate 1 and the like are provided. Generally, the external electrode terminals 8 are provided on the back surface of the circuit substrate 1 (see FIGS. 2(a) and 2(b)). Note however that the present invention is not limited to this, and the external electrode terminals 8 can be provided on an upper surface of the circuit substrate 1. For example, solder, gold, or the like can be used as the external electrode terminals 8. Further, the external electrode terminals 8 are not particularly limited in shape, and can have a shape such as a globular shape or a land shape.

Furthermore, according to the semiconductor device 20, the circuit substrate 1 is sealed with two sorts of resin, that is, (i) a transparent sealing resin 6 with which the optical semiconductor element 3 is sealed and (ii) a sealing resin 7 with which a region other than a region for the optical semiconductor element 3 is provided (see FIG. 2(b)) is sealed.

The transparent sealing resin 6 is provided so as to seal the optical semiconductor element 3 is sealed with the transparent sealing resin 6. The transparent sealing resin 6 transmits light, and so the light can travel through inside the transparent sealing resin 6. Accordingly, the transparent sealing resin 6 functions as a transmission path for a light signal. In the present embodiment, the transparent sealing resin 6 has a columnar shape. Note however that the present invention is not limited, to this, and instead the transparent sealing resin 6 can have a truncated cone shape or the like, for example.

The sealing resin 7 has a cuboid outer shape, and is provided so as to surround a sidewall of the transparent sealing resin 6. A region, on the circuit substrate 1 except the region where the optical semiconductor element 3 is provided, is sealed with the sealing resin 7.

A way to provide each of the transparent sealing resin 6 and the sealing resin 7 is not particularly limited. For example, the resins can be provided by: a compression molding method or a transfer molding method in which resin molding is carried out by applying pressure to the resins with the use of press and a metallic mold; a potting method in which coating is carried out by dropping a liquid resin; or the like.

As described above, the sealing resin 7 is provided on the circuit substrate 1 so as to surround the sidewall of the transparent sealing resin 6 having the columnar shape. This causes the transparent sealing resin 6 to be roundly exposed in a part of the top surface of the semiconductor device 20 (see FIG. 2(a)). The part of the top surface, in which part the transparent sealing resin 6 is exposed, functions as an optical interface 6a via which an optical fiber 50 is connected to the optical semiconductor element 3. Thus, the semiconductor device 20 has an arrangement in which a top surface of a semiconductor package has the optical interface 6a.

Note that in a case where the sealing is carried out with the use of a single sort of resin, it is necessary to seal an entire region on the circuit substrate 1 with a transparent sealing resin 6. Under the circumstances, in a case where a plurality of optical semiconductor elements 3 are provided on the circuit substrate 1, there is a risk that one of the plurality of optical semiconductor elements 3 could have light from other(s) of the plurality of optical semiconductor elements 3. This problem can be solved by (i) individually sealing the plurality of optical semiconductor elements 3 with respective transparent sealing resins 6, and (ii) sealing the other part with the sealing resin 7. There is no specific way to provide the resin with which each of the semiconductor element 2, the optical semiconductor element 3, and their electrical connection sections is sealed.

As described above, the semiconductor device 20 has a feature in which an outer surface of the sealing resin of a single-sided sealed package, such as a BGA or a CSP, which can be provided on the circuit substrate 1, has the optical interface 6a so as to allow the semiconductor device 20a to be directly fitted into connector 40. Further, the single-sided sealed package, such as the BGA or the CSP, allows the external electrode terminals 8 to be arranged in an area array. Therefore, a serializer member, a deserializer member, or the like can be provided inside the semiconductor device 20. This can realize an optical interface built-in SIP (System In Package) in 1 PKG. Therefore, the semiconductor device 20 needs a smaller space where the semiconductor device is fitted into the connector.

Next, the following description deals with a connection between the semiconductor device 20 and the optical fiber (optical transmission member) 50, with reference to FIG. 1. An end of the optical fiber 50 is provided with the connector 40 having a shape of cuboidal box that has no bottom surface. The sealing resin 7 of the semiconductor device 20 is fitted into an inner surface of the connector 40 while the optical interface 6a and the end of the optical fiber 50 are facing each other. This allows the optical fiber 50 to be connected to the semiconductor device 20.

For example, the optical fiber 50 connected to the optical interface 6a can be a plastic fiber, a glass fiber, an optical waveguide forming wire, or the like.

After various members, such as the optical semiconductor element 3, provided on the circuit substrate 1, are sealed with the transparent sealing resin 6 and the sealing resin 7 as described above, the sealing resin 7 is fitted into the connector 40 provided at the end of the optical fiber 50. This allows the optical fiber 50 to be easily attached/detached to/from the semiconductor device 20. Thereby, it is possible to realize the optical semiconductor device having a higher handleability and a higher maintainability than those of a conventional optical semiconductor device. Further, since a high-speed signal is optically transmitted, it is not necessary to provide a great number of external terminals, wiring regions, and development resources for designing them, each of which is conventionally required. Therefore, a secondary effect of a significant decrease in system cost is expected.

Note here that, in a case where the optical interface 6a and the end of the optical fiber 50 do not face each other, the optical signal cannot be transmitted between the optical semiconductor element 3 and the optical fiber 50. For this reason, it is necessary to fit the connector 40 into the sealing resin 7 while the optical interface 6a and the end of the optical fiber 50 are facing each other. In view of such requirement, the present embodiment is arranged so that one corner of an outer shape of the package of the sealing resin 7 is cut out in a direction perpendicular to the top surface of the semiconductor device 20. This causes the sealing resin 7 to have a cutout part (deformed part) 10. Further, the connector 40 has an inner surface which extends in accordance with the outer shape of the sealing resin 7.

FIGS. 3(a) through 3(d) are plan views each of which illustrates a direction in which the semiconductor device 20 is fitted into the connector 40. The cutout part 10 is formed in a position on the top surface of the sealing resin 7 other than at the center of the top surface, so that the outer shape of the package of the semiconductor device 20 has no rotational symmetry (see FIGS. 3(a) through 3(d)). Further, as illustrated in FIGS. 3(a) through 3(d), the connector 40 has, inside, a concave part in accordance with the outer shape of the package of the semiconductor device 20.

Therefore, the semiconductor device 20 can be fitted into the connector 40 only in the case of FIG. 3(a). In contrast, the semiconductor device 20 cannot be fitted into the connector 40 due to a physical interference from the outer surface of the sealing resin 7, in a case where the connector 40 is rotated by any of angles of 90°, 180°, and 270° with respect to the semiconductor device 20. Further, as illustrated in FIG. 3(a), the optical interface 6a and the end of the optical fiber 50 are located so as to face each other only in a case where the semiconductor device 20 is fitted into the connector 40. Thus, according to the present embodiment, (i) the sealing resin 7 has the cutout part 10 so that the outer shape of the package of the semiconductor device 20 has no rotational symmetry and (ii) the connector 40 has, inside, the concave part in accordance with the outer shape of the package of the semiconductor device 20. With the arrangement, it becomes possible to realize a simple and secure connection between the semiconductor device 20 and the optical fiber 50 because a human error which is likely to occur when the semiconductor device 20 is fitted into the connector 40.

The cutout part 10 is formed by a method such as (1) a method of forming a cutout by use of a metallic mold when the resin sealing is carried out, and then dividing the sealed product into a plurality of packages or (2) a method of sealing an entire object with a resin, and then forming a cutout in a step of dividing the sealed product into a plurality of packages. A metallic mold, a blade, a waterjet, or the like can be used as a process for forming the cutout part 10. Note however that a method and a process for forming the cutout part with respect to the outer shape of the package of the semiconductor device 20 are not particularly limited.

According to the present embodiment, the outer shape of the connector 40 is deformed in accordance with the inner shape of the connector 40, as illustrated in FIGS. 3(a) though 3(d). Note however that the present invention is not limited to this. It is also possible to deform only the inner shape of the connector 40 in accordance with the outer shape of the package of the semiconductor device 20.

Alternatively, it is possible that the circuit substrate 1 also has a cutout part so that not only the sealing resin 7 but also the circuit substrate 1 is fitted into the connector 40. In a case of a semiconductor device in which no sealing resin 7 is provided, it is possible that the circuit substrate 1 has the cutout part so that the circuit substrate 1 is fitted into the connector 40. In this case, for a stable connection, it is preferable that the circuit substrate 1 has a high strength.

FIG. 4 is a perspective view illustrating a modified example of the connection between the semiconductor device 20 of the present embodiment and the optical fiber 50. As illustrated in FIG. 4, for further successful physical fitting of the semiconductor device 20 into the connector 40, a claw-shaped protrusion 41 having flexibility is provided on each of two opposite sidewalls of the connector 40. A claw section of each of the claw-shaped protrusions 41 hooks and locks a clearance between the external electrode terminals 8 provided on the bottom surface of the circuit substrate 1. This allows the optical fiber 50 to be stably fixed to the semiconductor device 20.

FIG. 5(a) is a plan view of another modified example of the present embodiment, illustrating a semiconductor device 20a having two optical interfaces. Further, FIG. 5(b) is a perspective view illustrating the fitting of the semiconductor device 20a into a connector 40a. In a case where a signal is actually transmitted optically, there might not always be one pair of optical input/output but a plurality of pairs of optical input/output. In a case where there are a plurality of pairs of optical input/output, it is necessary to prepare a plurality of optical interfaces 6a as many as sorts of optical signals.

Therefore, the semiconductor device 20a has two optical interfaces 6a (see FIG. 5(a)). Although the semiconductor device 20a thus has a plurality of optical interfaces 6a (see FIG. 5(a)), the semiconductor device 20a can be fitted into the connector 40a accurately and securely. This is because the semiconductor device 20a has the cutout part 10.

Note that the number of the optical interfaces 6a is not particularly limited. It is possible to provide three or more optical interfaces 6a, as illustrated in FIGS. 6(a) through 6(c). FIG. 6(a) illustrates an arrangement in which four optical interfaces 6a are arranged in an area array, FIG. 6(b) illustrates an arrangement in which eight optical interfaces 6a are arranged linearly, and FIG. 6(c) illustrates an arrangement in which four optical interfaces 6a are arranged linearly.

In a case where any of the semiconductor devices of FIGS. 6(a) through 6(c) is connected to optical fibers, the semiconductor device is fitted into the connector so that one ends of the optical fibers 50 face the respective optical interfaces 6a (see FIGS. 6(d) through 6(f)). Thus, the number of the optical interfaces 6a and the layouts of the optical interfaces 6a can be appropriately determined in accordance with the sort of optical signal, a size of the semiconductor device, or the like. Further, the inner shape of a connector, the number of the optical fibers connected to the connector, the layouts of the optical fibers connected to the connector can be appropriately determined in accordance with a corresponding semiconductor device which is fitted into the connector.

FIG. 7(a) is a plan view illustrating a semiconductor device 20b in accordance with a further modified example of the present embodiment. Further, FIG. 7(b) is a perspective view illustrating the fitting of the semiconductor device 20b into a connector 40b. According to the semiconductor device 20b, a side of an outer shape of a package of the semiconductor device 20b has a cutout part 10b (see FIG. 7(a)). A layout of the cutout part 10b is not limited to a corner of the outer shape of the package of the semiconductor device 20b, provided that the cutout part is formed so that the semiconductor device 20b has a shape having no rotational symmetry.

Further, as illustrated in FIG. 7(b), the connector 40b has an inner surface including a protrusion part having a shape in accordance with the outer package contour of the semiconductor device 20b. It follows that the semiconductor device 20b is fitted into the connector 40b only in a certain direction.

FIG. 8(a) is a plan view illustrating a semiconductor device 20c in accordance with still another modified example of the present embodiment. Further, FIG. 8(b) is a perspective view illustrating a connection between the semiconductor device 20c and the optical fibers 50. As illustrated in FIG. 8(a), the semiconductor device 20c has two optical interfaces 6a. This causes the semiconductor device 20c to have a rotational symmetry of 180°. Further, the semiconductor device 20c has an arrangement in which one side of an outer package contour of the semiconductor device 20b has two cutout parts 10b. Further, a connector 40c has, inside, protrusion parts having shapes in accordance with the outer package contour of the semiconductor device 20c (see FIG. 8(b)). As described above, the number of the cutout parts 10b is not limited to one. The number of the cutout parts 10b is not particularly limited as long as the cutout parts 10b are formed so that the semiconductor device 20b has no rotational symmetry. Specifically, in a case where a plurality of cutout parts 10b are formed, the cutout parts 10b are located so as not to be symmetric with each other with respect to a central point on the top surface of the sealing resin 7.

FIG. 9(a) is a plan view illustrating a semiconductor device 20d in accordance with a further modified example of the present embodiment. Further, FIG. 9(b) is a cross-sectional view of the semiconductor device 20d, taken along a line A-A'. Furthermore, FIG. 9(c) is a perspective view illustrating the fitting of the semiconductor device 20d into a connector 40d. As illustrated in FIG. 9(a), According to the semiconductor device 20d, the semiconductor device 20a illustrated in FIG. 5(a) further has a concave part 10d recessed in a direction of a normal line of the top surface of the sealing resin 7. The connector 40d, into which the sealing resin 7 of the semiconductor device 20d is fitted, should have a clearance for smooth fitting of the semiconductor device 20d into the connector 40d. However, such a clearance may cause generation of a risk that the one ends of the optical fibers 50 deviate from the positions of the respective optical interfaces 6a. This may block optical transmission between the optical fibers 50 and the optical interfaces 6a, depending on optical characteristics of the adopted optical semiconductor elements 3.

In order to prevent such a risk, (i) the top surface of the semiconductor device 20 has a concave part 10d in the top surface of the semiconductor device 20d where the optical interfaces 6a are provided and (ii) a protrusion part is provided on the connector 40d so as to face the concave part 10d (see FIG. 9(b)). This allows the sealing resin 7 of the semiconductor device 20d to be securely fitted into the connector 40d. Accordingly, as illustrated in FIG. 9(c), the semiconductor device 20d and the connector 40d are arranged such that the inner surface of the connector 40d, which faces the top surface of the semiconductor device 20d, is in contact with the top surface of the semiconductor device 20d.

Note that FIG. 9(d) is a cross-sectional view illustrating a concave part 10d' in accordance with a modified example of the concave part 10d illustrated in FIG. 9(b). As illustrated in FIG. 9(d), the concave part 10d' has a taper shape. This allows the sealing resin 7 of the semiconductor device 20d to be more easily fitted into the connector 40d. Further, the semiconductor device 20d has not only the concave part 10d but also the cutout part 10. However, the present invention is not limited to this.

FIG. 10(a) is a plan view illustrating a semiconductor device 20d' in accordance with a modified example of the semiconductor device 20d illustrated in FIG. 9(a). Further, FIG. 10(b) is a perspective view illustrating a connection between the semiconductor device 20d' and the optical fibers 50. The semiconductor device 20d' has no cutout part 10 but only a concave part 10d. One ends of the respective optical fibers 50 are provided with a connector 40d', and the connector 40d' has an inner surface shape which extends in accordance with an outer surface of the semiconductor device 20d'. Note that in a case where only a single concave part 10d is provided, the concave part 10d should be provided in an area other than the center on the top surface of the sealing resin 7.

FIG. 11(a) is a plan view illustrating a semiconductor device 20e in accordance with still another modified example of the present embodiment. Further, FIG. 11(b) is a cross-sectional view illustrating the semiconductor device 20e, taken along a line B-B'. Further, FIG. 11(c) is a perspective view illustrating a connection between the semiconductor device 20e and the optical fibers 50.

As illustrated in FIG. 11(b), the semiconductor device 20e has a protrusion part 10e projecting in a direction of the normal line of the outer surface of the sealing resin 7. Therefore, even if the connector 40e has a clearance, the sealing resin of the semiconductor device 20e can be successfully fitted into the connector 40e, in the same manner as the arrangement illustrated in FIGS. 9(a) through 9(c). Note that FIG. 11(d) is a cross-sectional view illustrating a protrusion part 10e' in accordance with a modified example of the protrusion part illustrated in FIG. 11(b). The protrusion part 10e' has a taper shape, as illustrated in FIG. 11(d). This allows further easier fitting of the sealing resin 7 of the semiconductor device 20e into the connector 40e. Further, the semiconductor device 20e has not only the protrusion part 10e but also a deformed part (cutout part) 10. Note however that the present invention is not limited to this.

FIG. 12(a) is a plan view illustrating a semiconductor device 20e' in accordance with a modified example of the semiconductor device 20e illustrated in FIG. 11(a). Further, FIG. 12(b) is a perspective view illustrating a connection between the semiconductor device 20e' and the optical fibers 50. The semiconductor device 20e' has no cutout part 10 but only a protrusion part 10e. One end of the optical fiber 50 is provided with a connector 40e', and the connector 40e' has an inner surface shape which extends in accordance with an outer surface of the semiconductor device 20e'. Note that in a case where only a single protrusion part 10e is provided, the protrusion part 10e should be positioned in an area other than the center on the top surface of the sealing resin 7.

Generally, the concave part 10d or the protrusion part 10e is provided by use of a metallic mold when the semiconductor device is sealed with a resin. However, a method or process for providing the concave part 10d or the protrusion part 10e is not particularly limited.

As explained above with reference to FIGS. 9(a) through 9(d) and FIGS. 11(a) through 11(d), the concave part 10d or the protrusion part 10e is provided so that the semiconductor device 20 has no rotational symmetry. This allows the optical fibers 50 to be connected to the semiconductor device 20 while the optical interfaces 6a and the optical fibers 50 are facing each other.

Further, the concave part 10d or the protrusion part 10e can function as an optical interface 6a. That is, the concave part 10d or the protrusion part 10e can be formed in the same position as the optical interface 6a. FIG. 13(a) is a plan view illustrating a semiconductor device 20f in accordance with still another modified example of the present embodiment. Further, FIG. 13(b) is a cross-sectional view illustrating the semiconductor device 20f, taken along a line C-C'. FIG. 13(c) is a perspective view illustrating the semiconductor device 20f.

According to the semiconductor device 20f, a sidewall of a concave part 10f is provided so as to surround the optical interface 6a (see FIG. 13(a)). That is, as illustrated in FIG. 13(b), the optical interface 6a functions as a bottom surface of the concave part 10f. Thus, the concave part 10f can be arranged so as to function as the optical interface 6a.

FIG. 14(a) is a plan view illustrating a semiconductor device 20g in accordance with still another modified example of the present embodiment. FIG. 14(b) is a cross-sectional view illustrating the semiconductor device 20g, taken along a line D-D'. FIG. 14(c) is a perspective view illustrating the semiconductor device 20g.

According to the semiconductor device 20g, a sidewall of a protrusion part 10g is provided so as to surround the optical interface 6a (see FIG. 14(a)). That is, as illustrated in FIG. 14(b), the optical interface 6a functions as a top surface of the protrusion part 10g. Thus, the protrusion part 10g can be arranged so as to function as the optical interface 6a.

In the above descriptions of the present embodiment, the top surface of the semiconductor device has the optical interface. However, the present embodiment is not limited to this. Next, the following description deals with an arrangement in which a side surface of the semiconductor device has an optical interface.

Figure 3:
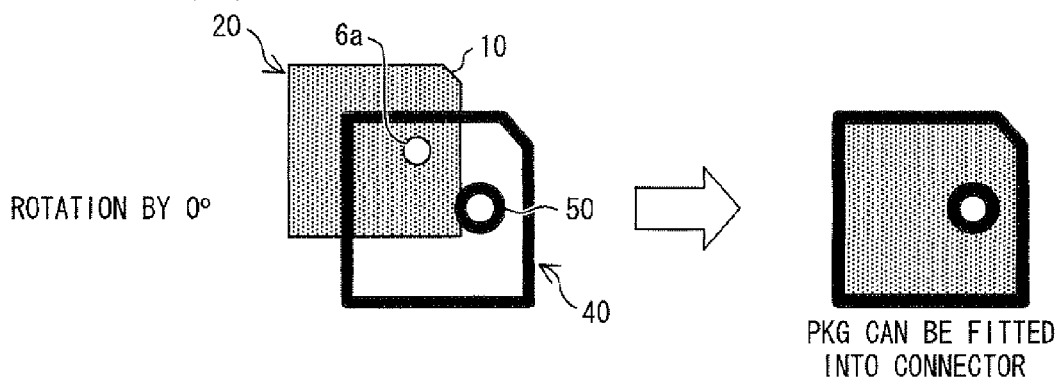
FIG. 3(a)
FIG. 3(b)
FIG. 3(c)
FIG. 3(d)
Figure 3:
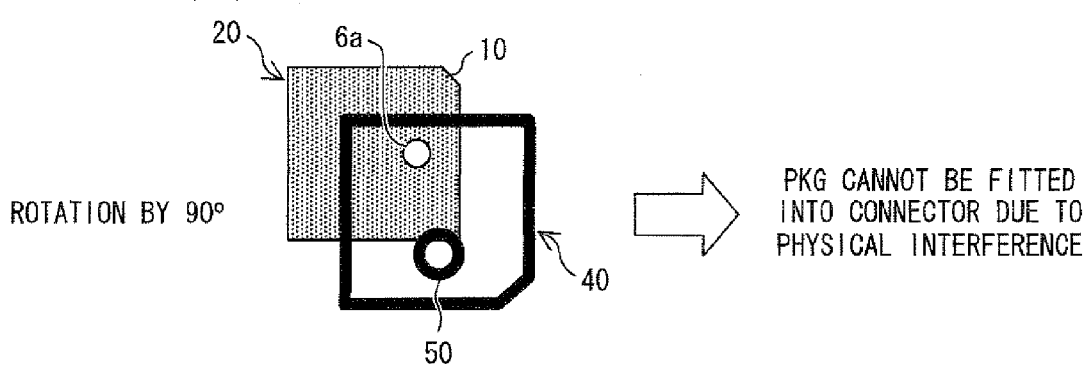
Figure 3:
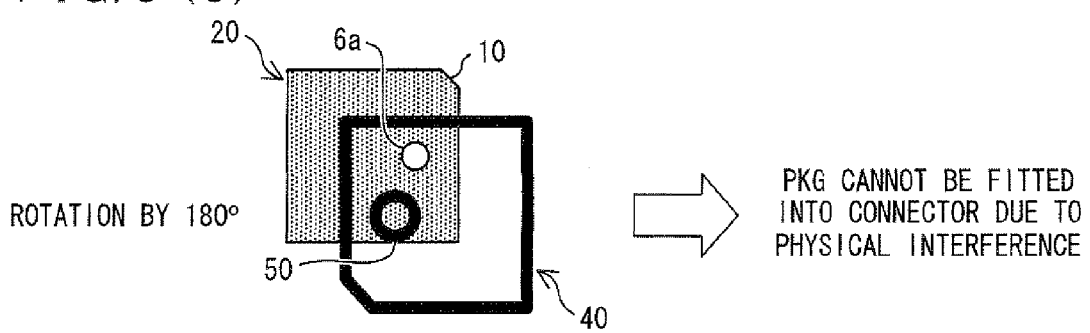
Figure 3:
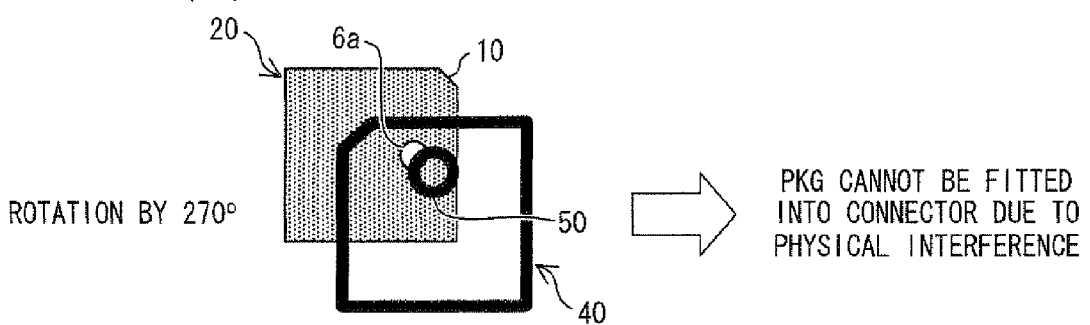
Figure 5:
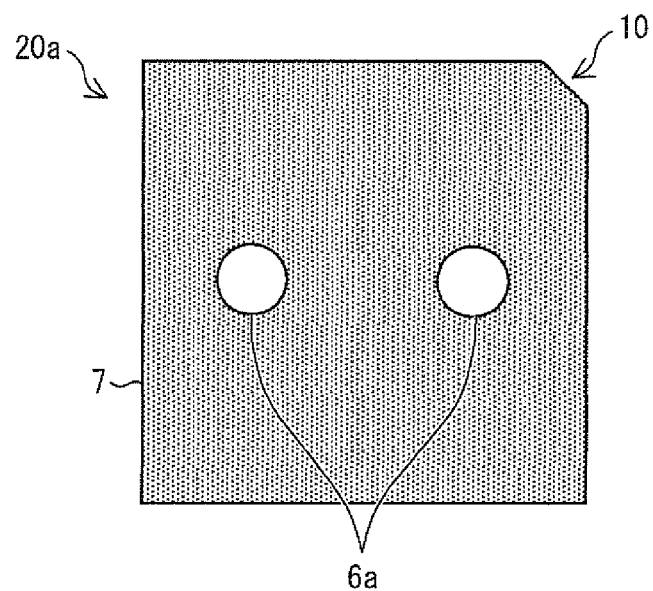
FIG. 5(a)
FIG. 5(b)
Figure 5:
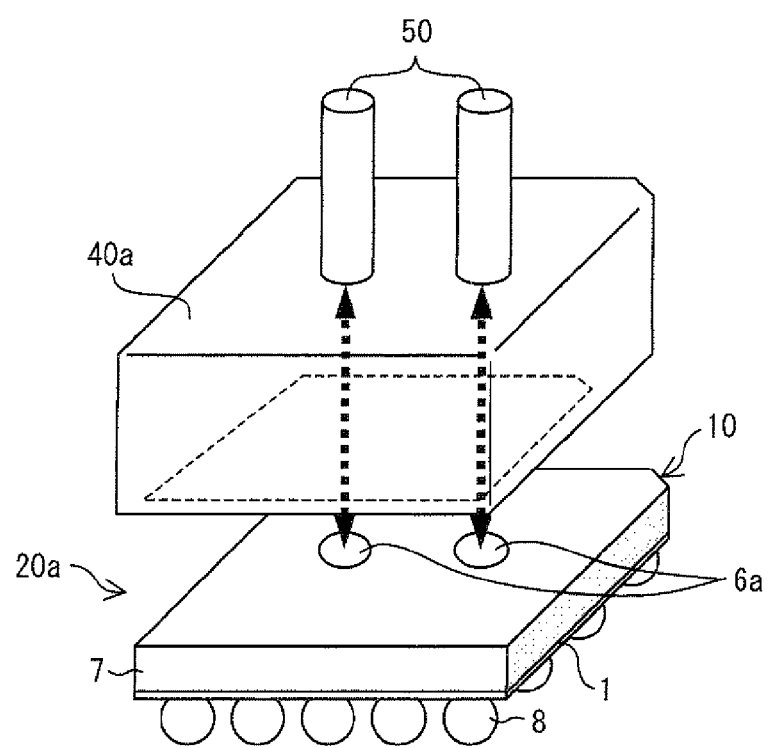
Figure 7:
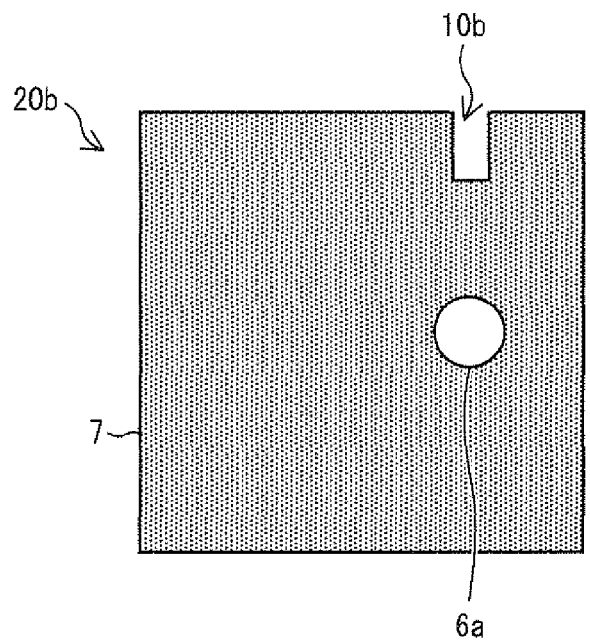
FIG. 7(a)
FIG. 7(b)
Figure 7:
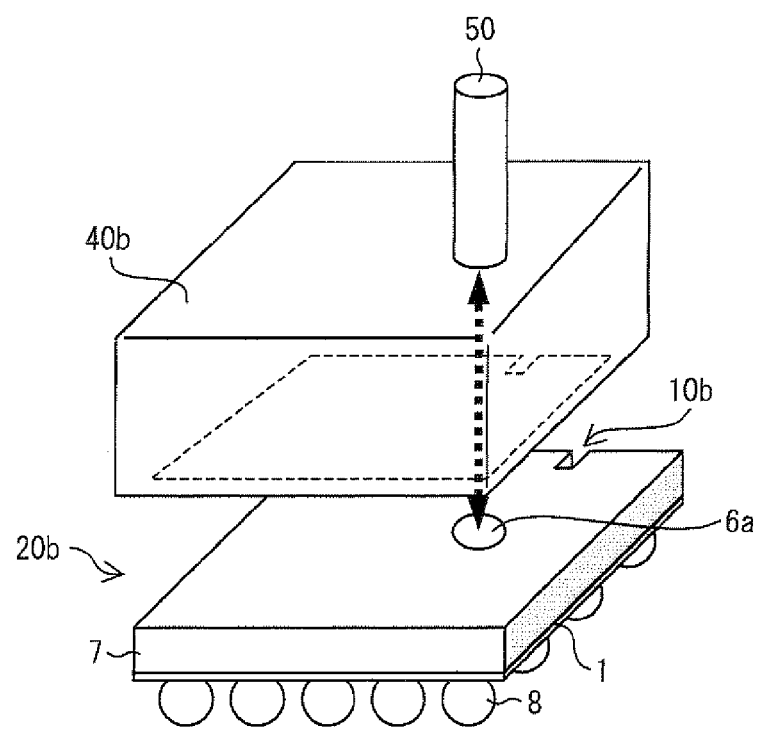
Figure 8:
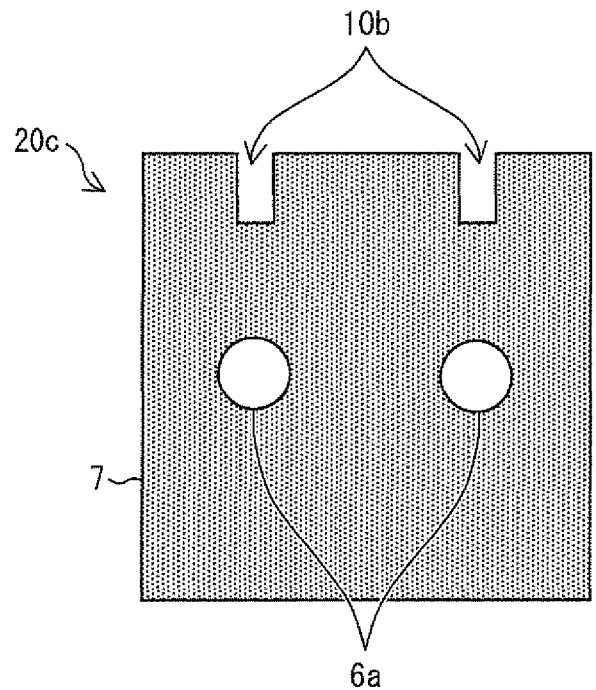
FIG. 8(a)
FIG. 8(b)
Figure 8:
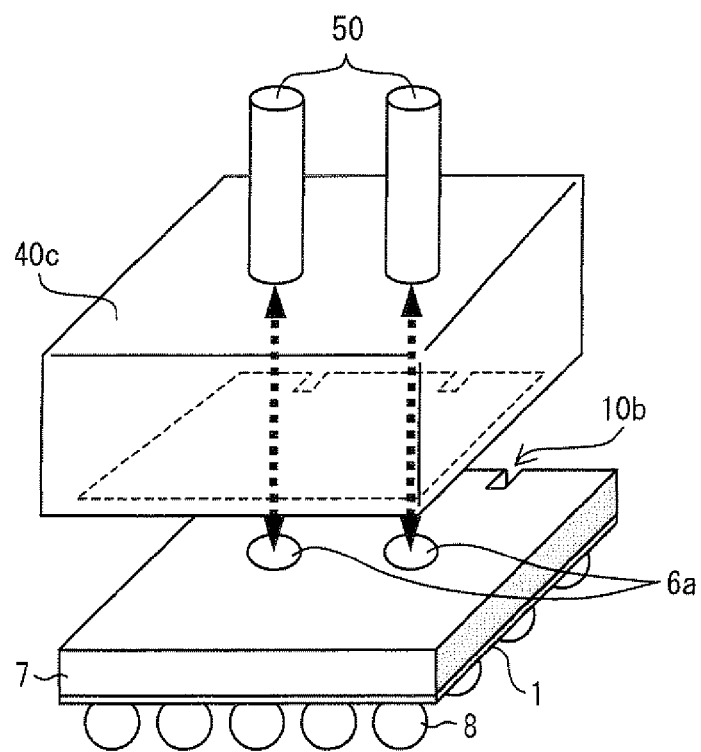
Figure 10:
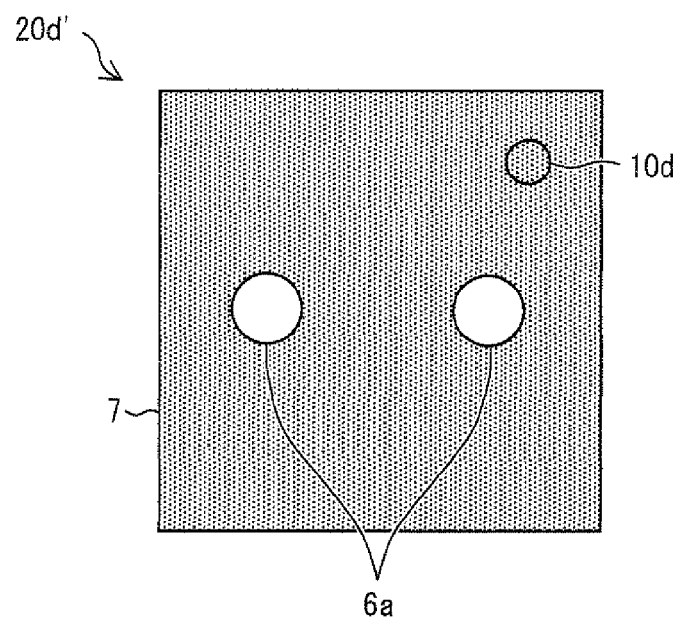
FIG. 10(a)
FIG. 10(b)
Figure 10:
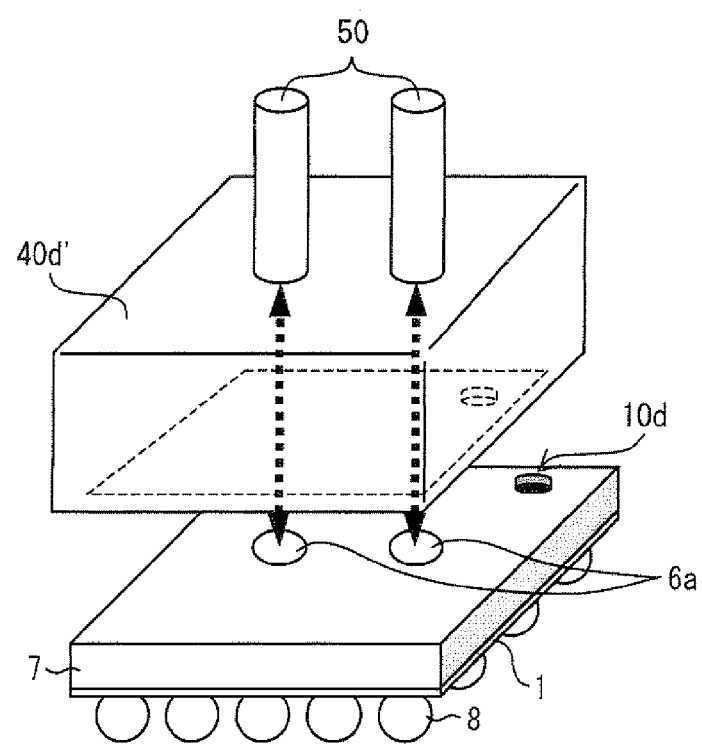
Figure 15:
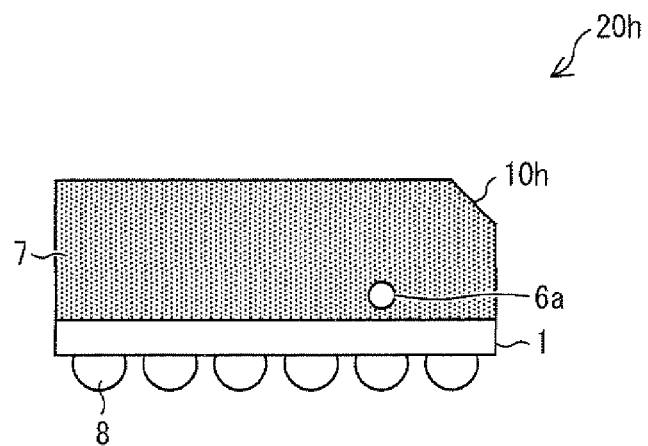
FIG. 15(a)
FIG. 15(b)
Figure 15:
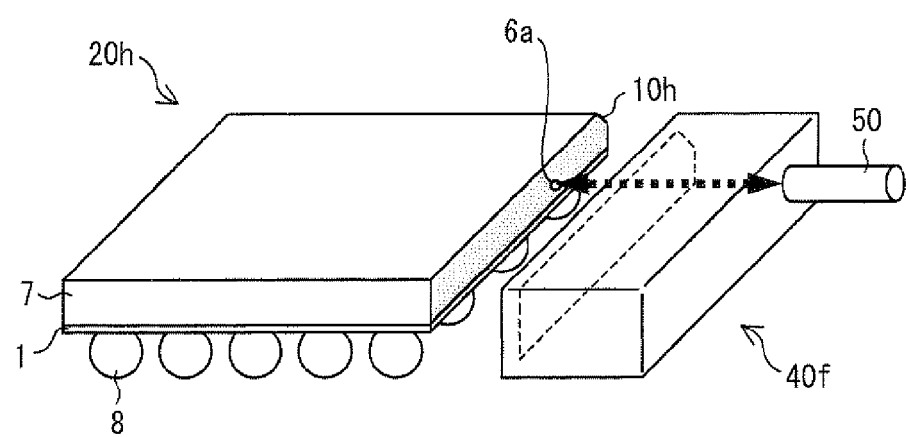

FIG. 15(a) is a side view illustrating a semiconductor device 20h in accordance with still another modified example of the present embodiment. Further, FIG. 15(b) is a perspective view for explaining a connection between the semiconductor device 20h and the optical fiber 50. According to the semiconductor device 20h, a side surface of the sealing resin 7 has the optical interface 6a, and one corner of the sealing resin 7 is cut out in a horizontal direction. This provides a cutout part 10h.

As illustrated in FIG. 15(b), in a case where the optical fiber 50 is connected to the semiconductor device 20h, the side surface of the semiconductor device 20h, which side surface has the optical interface 6a is fitted into a connector 40f provided at one end of the optical fiber 50. Since the semiconductor device 20h has the cutout part 10h, the side surface of the semiconductor device 20h has no rotational symmetry due to its outer shape. Further, the connector 40f has an inner surface shape in accordance with the outer surface of the sealing resin 7 of the semiconductor device 20h. This can successfully secure prevention of the semiconductor device 20h from being, in an erroneous direction, fitted into the connector 40f.

Figure 16:
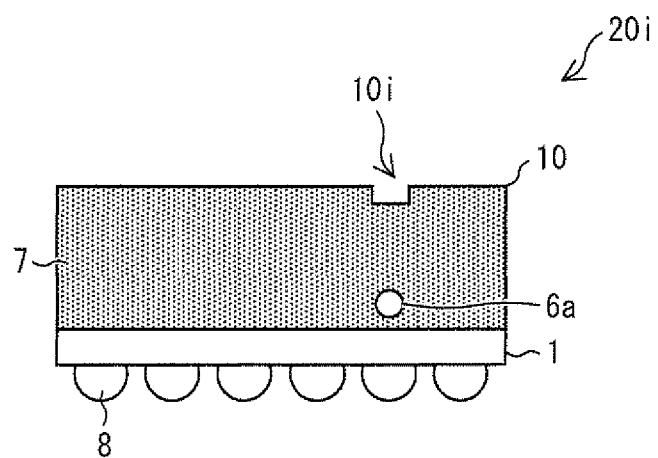
FIG. 16(a)
FIG. 16(b)
Figure 16:
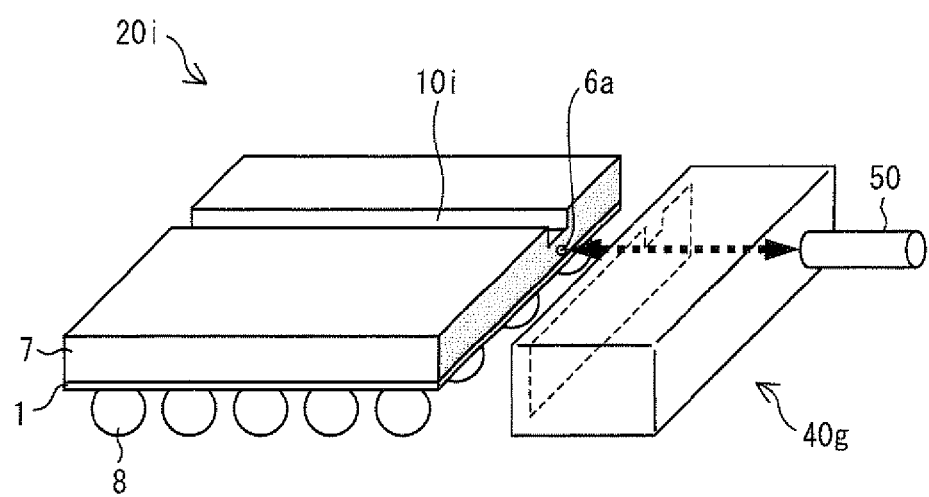

Further, the semiconductor device can have a groove 10i on the top surface of the sealing resin 7 in place of the cutout part 10h so as to have the outer shape having no rotational symmetry, like a semiconductor device 20i illustrated in FIG. 16(a). A connector 40g illustrated in FIG. 16(b) has an inner surface which extends in accordance with the outer surface of the sealing resin of the semiconductor device 20i. This can secure prevention of the semiconductor device 20i from being, in an erroneous direction, fitted into the connector 40g, when the semiconductor device 20i is connected to the optical fiber 50.

[Embodiment 2]

Figure 17:
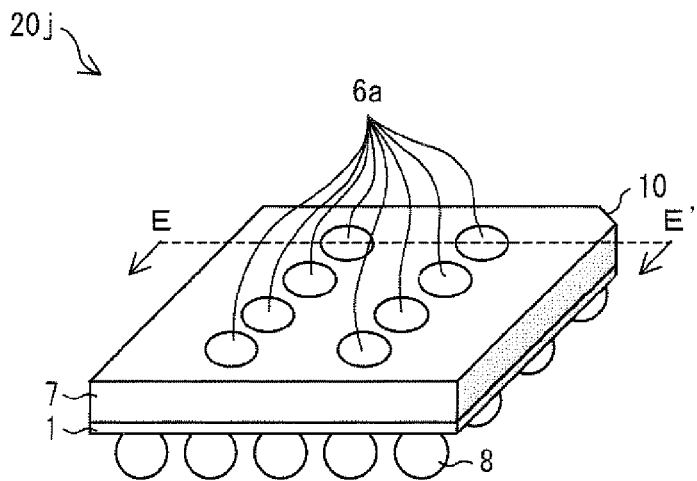
FIG. 17(a)
FIG. 17(b)
FIG. 17(c)
Figure 17:
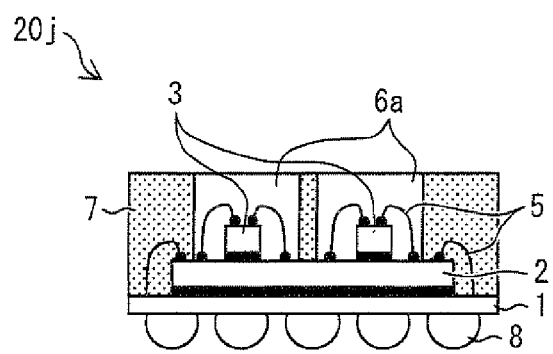
Figure 17:
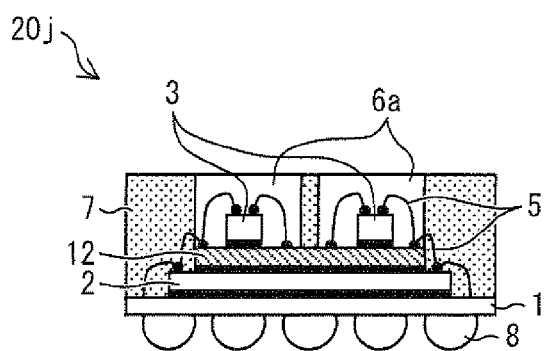

The second embodiment of the present invention is specifically described below with reference to FIG. 17. The present embodiment deals with a semiconductor device in which an optical semiconductor element and a semiconductor element are arranged on a circuit substrate in a three-dimensional manner.

FIG. 17(a) is a perspective view illustrating a semiconductor device 20j in accordance with the present embodiment. FIG. 17(b) is a cross-sectional view illustrating the semiconductor device 20j, taken along a line E-E'. With the arrangement in which the semiconductor element and the optical semiconductor element are juxtaposed, like the arrangement explained in Embodiment 1, it is difficult to arrange a great number of the optical semiconductor elements on the circuit substrate due to a fact that the circuit substrate has a limited area. In contrast, the present embodiment is arranged so that a semiconductor element 2 and an optical semiconductor element 3 are arranged in the three-dimensional manner (see FIG. 17(b)).

Since the optical semiconductor element 3 has to face a top surface of the semiconductor device 20j, the optical semiconductor element 3 is stacked above the semiconductor element 2 (see FIG. 17(b)). Note, however, that the optical semiconductor element 3 cannot be sometimes directly stacked above the semiconductor element 2, depending on (i) a size of the semiconductor element 2 arranged below the optical semiconductor 3, (ii) the number of the semiconductor elements, (iii) how the optical semiconductor element 3 is contacted, or the like.

In view of the circumstances, an interposer chip (interposer substrate) 12 is provided between the semiconductor element 2 and the optical semiconductor element 3 (see FIG. 17(c)). With this arrangement, the optical semiconductor element 3 can be stacked above the semiconductor element 2. Thus, by efficiently providing a plurality of optical semiconductor elements 3 on the circuit substrate 1, it becomes possible to realize the semiconductor device 20j whose top surface has a great number of optical interfaces 6a (see FIG. 17(a)).

[Embodiment 3]

The third embodiment of the present invention is specifically described below with reference to FIGS. 18(a) through 18(c) and FIGS. 19(a) through 19(d). The present embodiment describes a semiconductor device realized by a combination of two semiconductor devices, one of which includes a semiconductor element and the other of which includes an optical semiconductor element.

FIG. 18(a) is a perspective view illustrating a semiconductor device 21 in accordance with the present embodiment. The semiconductor device 21 is realized by combining a semiconductor device 21a illustrated in FIG. 18(b) and a semiconductor device 21b illustrated in FIG. 18(c).

As illustrated in FIG. 18(b), the semiconductor device 21a has an arrangement in which (i) a semiconductor element (not illustrated) is provided on a circuit substrate 1a and (ii) a sealing resin 7a is provided with which the semiconductor element is sealed. Further, external electrodes 11, via which the semiconductor device 21a is electrically connected to the semiconductor device 21b, are provided on a part of a surface of the circuit substrate 1a, on which part the semiconductor device 21b is to be provided.

As illustrated in FIG. 18(c), the semiconductor device 21b has an arrangement in which (i) optical semiconductor elements (not illustrated) are provided on a circuit substrate 1b, (ii) a sealing resin 7b is provided with which the optical semiconductor elements are sealed, and (iii) a top surface of the sealing resin 7b has optical interfaces 6a. A cutout part 10 is further provided at one corner of the sealing resin 7b. In the semiconductor device 21b, the top surface of the sealing resin 7b has the optical interfaces 6a. However, the layout of the optical interfaces 6a is not limited to the top surface.

FIG. 19(a) is a perspective view illustrating a semiconductor device 22 in accordance with a modified example of the present embodiment. The semiconductor device 22 is realized by a combination of the semiconductor device 21a illustrated in FIG. 19(b) and a semiconductor device 22a illustrated in FIG. 19(c). The semiconductor device 21a illustrated in FIG. 19(b) is the same as the semiconductor device 21a illustrated in FIG. 18(b).

As illustrated in FIG. 19(c), the semiconductor device 22a has an arrangement in which (i) the optical semiconductor elements (not illustrated) are provided on the circuit substrate 1b, (ii) a sealing resin 7c is provided with which the optical semiconductor elements are sealed, and (iii) a side surface of the sealing resin 7c has the optical interfaces 6a. Further, a cutout part 10 is provided at one corner of the sealing resin 7c.

Since the semiconductor element and the optical semiconductor element are thus provided in respective semiconductor devices, it becomes possible to select a semiconductor device including an optimum semiconductor element in accordance with (i) a size of semiconductor element to be used, (ii) the external electrodes, (iii) a size of a package of the semiconductor device, and/or the like.

[Embodiment 4]

The fourth embodiment of the present invention is specifically described below with reference to FIGS. 20, 21(a) and 21(b). The present embodiment deals with a case where any of semiconductor devices and any of connectors in accordance with Embodiments 1 through 3 are applied to a liquid crystal display device such as a flat-screen TV.

Figure 20:
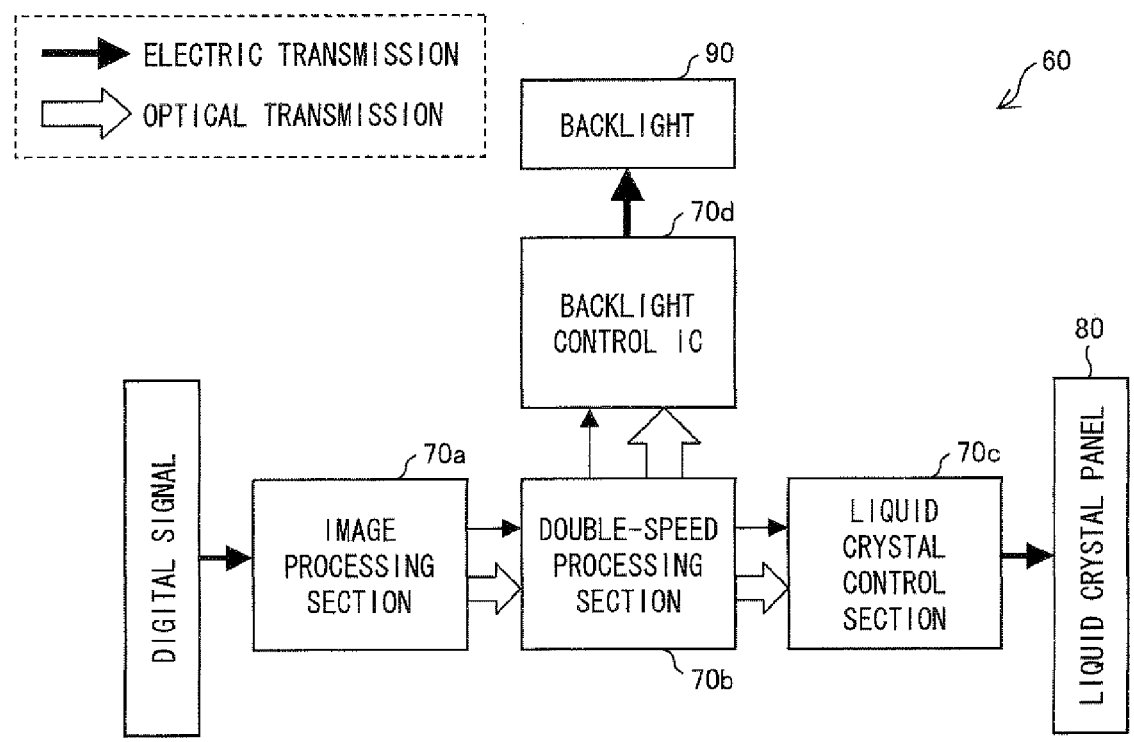
FIG. 20

FIG. 20 is a block diagram illustrating an arrangement of a liquid crystal display device 60 in accordance with the present embodiment. The liquid crystal display device 60 includes: an image processing section 70a; a double-speed processing section 70b; a liquid crystal control section 70c; a backlight control section 70d; a liquid crystal panel 80; and a backlight 90. The image processing section 70a creates image data for driving the liquid crystal panel 80 in response to an externally supplied digital signal. The double-speed processing section 70b creates interpolation image data for causing the liquid crystal panel 80 to be subjected to double-speed driving, and supplies double-speed image data to the liquid crystal control section 70c. Further, the double-speed processing section 70b supplies, to the backlight control section 70d, a lighting control signal for controlling the backlight 90. The liquid crystal control section 70c drives the liquid crystal panel 80 in response to the double-speed image data received from the double-speed processing section 70d. The backlight control section 70d controls the backlight 90 in response to the lighting control signal received from the double-speed processing section 70b. The image processing section 70a, the double-speed processing section 70b, the liquid crystal control section 70c, and the backlight control section 70d are realized by an LSI. Not only an electric signal but also an optical signal is communicated between the respective sections.

Figure 21:
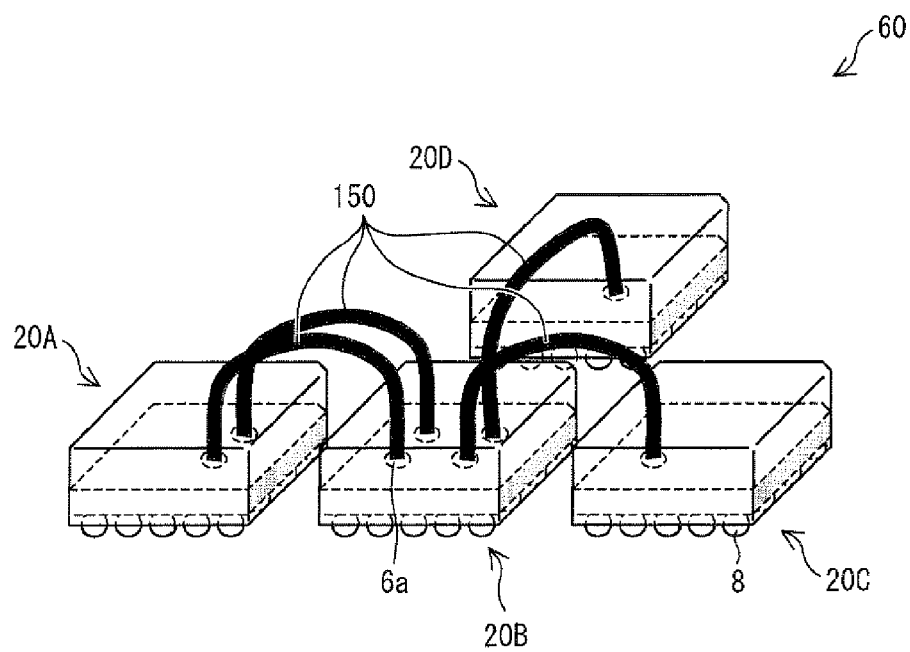
FIG. 21(a)
FIG. 21(b)
Figure 21:
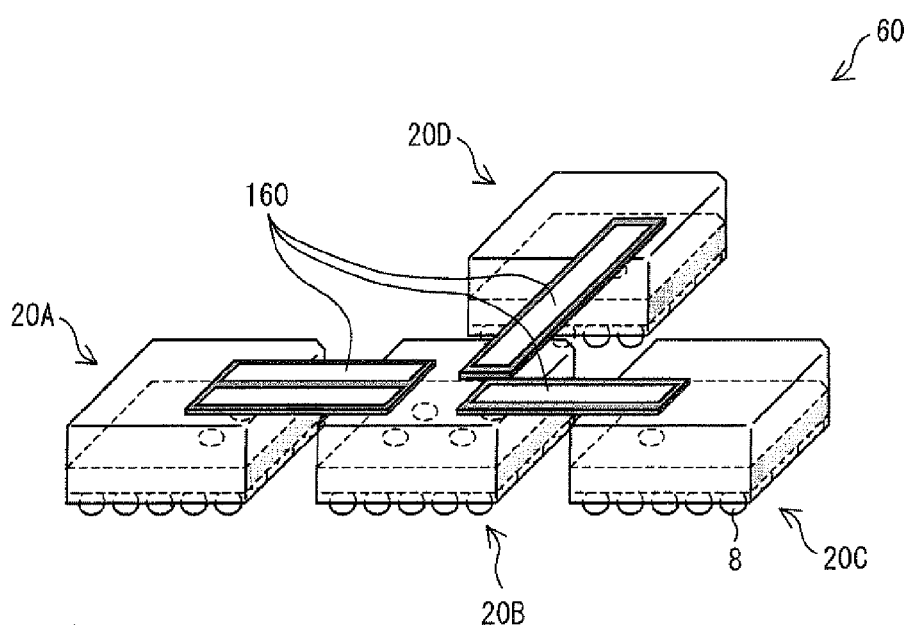
Figure 22:
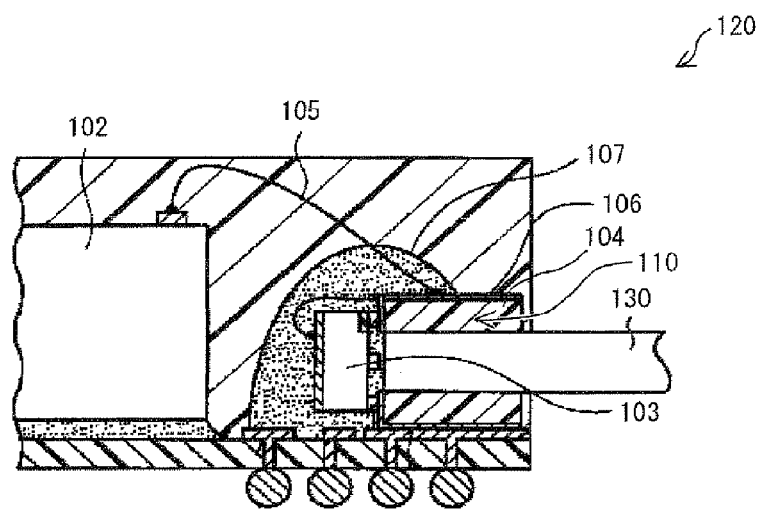
FIG. 22
Figure 23:
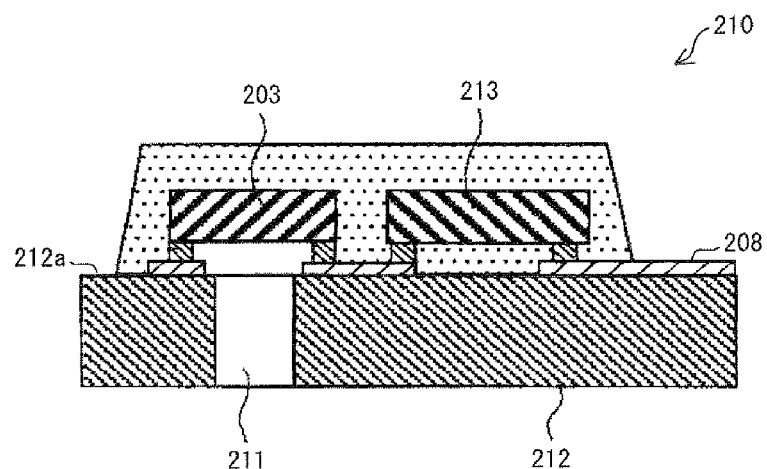
FIG. 23(a)
FIG. 23(b)
Figure 23:
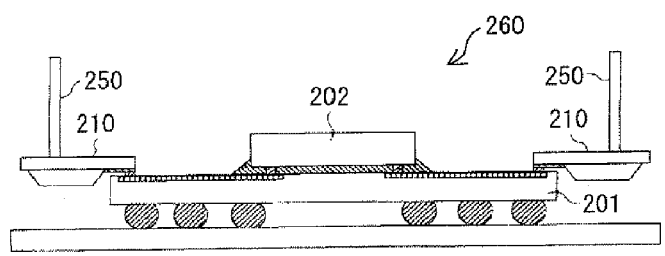

FIG. 21(a) is a perspective view illustrating an arrangement in which the image processing section 70a, the double-speed processing section 70b, the liquid crystal control section 70c, and the backlight control section 70d of the liquid crystal display device 60 illustrated in FIG. 20 are realized by semiconductor devices 20A through 20D, respectively. (i) The semiconductor devices 20A and 20B are connected with each other by an optical fiber 150, (ii) the semiconductor devices 20B and 20C are connected with each other by an optical fiber 150, and (iii) the semiconductor devices 20B and 20D are connected with each other by an optical fiber 150. Any of the semiconductor devices in accordance with Embodiments 1 through 3 can be adopted as any of the semiconductor devices 20A through 20D. Further, an optical fiber whose one end is provided with a corresponding one of the connectors in accordance with Embodiments 1 through 3 can be used as the optical fiber 150. This arrangement allows optical signals to be transmitted via the optical fibers 150 in the liquid crystal display device 60 illustrated in FIG. 20.

Further, FIG. 21(b) is a perspective view illustrating an arrangement in which the image processing section 70a, the double-speed processing section 70b, the liquid crystal control section 70c, and the backlight control section 70d are realized by the semiconductor devices 20A through 20D, respectively. In FIG. 21(b), the optical signals are transmitted in the liquid crystal display device 60 via optical waveguide forming wires 160 in place of the optical fibers 150.

In a case where a plurality of optical interfaces 6a are provided, like the semiconductor device 20B illustrated in FIGS. 21(a) and 21(b), it is the most efficient that the plurality of optical interfaces 6a are arranged to be symmetric with respect to a central point of the package. Here, each of the semiconductor devices has a deformed part so as to lose its rotational symmetry. This is an essential structure for secure optical transmission.

[Conclusion of Embodiments]

The present invention is not limited to the description of the embodiments above, but may be altered by a skilled person within the scope of the claims. An embodiment based on a proper combination of technical means disclosed in different embodiments is encompassed in the technical scope of the present invention.

Further, in the semiconductor device of the present invention, the deformed part may be provided by cutting out at least one corner of a top surface of the sealing resin in a direction perpendicular to the top surface.

According to the invention, at least one corner of the top surface of the sealing resin is cut out in the direction perpendicular to the top surface so as to provide the deformed part. Thereby, the top surface of the sealing resin loses its rotational symmetry.

Further, in the semiconductor device of the present invention, the deformed part may be provided by cutting out at least one side of the sealing resin.

According to the invention, at least one side of the sealing resin is cut out so as to provide the deformed part. Thereby, the outer surface of the sealing resin loses its rotational symmetry.

Further, in the semiconductor device of the present invention, the deformed part is a concave part recessed in a direction of a normal line of the outer surface of the sealing resin.

According to the invention, the deformed part is the concave part recessed in the direction of the normal line of the outer surface of the sealing resin. Thereby, the outer surface of the sealing resin loses its rotational symmetry. Further, even if a clearance for smooth fitting of the sealing resin into the connector is provided, it is possible to prevent such a clearance from preventing optical signals from being transmitted.

The concave part may have a taper shape.

According to the invention, the concave part has a taper shape. This allows the sealing resin of the semiconductor device to be easily fitted into a connector or the like.

Further, in the semiconductor device of the present invention, the deformed part may be a protrusion part projected in a direction of a normal line of the outer surface of the sealing resin.

According to the invention, the deformed part is the protrusion part projecting in the direction of the normal line of the outer surface of the sealing resin. Thereby, the outer surface of the sealing resin loses its rotational symmetry. Further, even if a clearance for smooth fitting of the sealing resin into the connector is provided, it is possible to prevent such a clearance from preventing optical signals from being transmitted.

Further, in the semiconductor device of the present invention, the protrusion part may have a taper shape.

According to the invention, the protrusion part has a taper shape. This allows the sealing resin of the semiconductor device to be easily fitted into a connector or the like.

Further, in the semiconductor device of the present invention, the semiconductor element may include at least one optical semiconductor element.

According to the invention, the semiconductor device includes the optical semiconductor element, so that the semiconductor device can be used as an optical semiconductor device.

Further, in the semiconductor device of the present invention, said at least one optical semiconductor element may be sealed with a transparent sealing resin; and the transparent sealing resin may be exposed in the outer surface.

According to the invention, the outer surface of the semiconductor device sealed with a resin has an exposed transparent sealing resin. This exposed transparent sealing resin can efficiently transmit an optical signal. This allows the exposed transparent sealing resin to be suitably used as an optical interface for connecting the optical semiconductor element to the optical wire having an external connection. Therefore, it is possible to realize a semiconductor device to/from which the optical wire can be easily attached/detached.

Further, in the semiconductor device of the present invention, the transparent sealing resin thus exposed may constitute a part of the deformed part.

According to the invention, the exposed transparent sealing resin, functioning as the optical interface, can also function as the deformed part.

Further, in the semiconductor device of the present invention, said at least one optical semiconductor element may be a plurality of optical semiconductor elements arranged in an area array on the circuit substrate.

Further, in the semiconductor device of the present invention, said at least one optical semiconductor element may be a plurality of optical semiconductor elements arranged linearly on the circuit substrate.

According to the invention, it is possible to efficiently provides the plurality of optical semiconductor elements.

Further, in the semiconductor device of the present invention, said at least one optical semiconductor element may be provided above the semiconductor element.

According to the invention, the optical semiconductor element is provided above the semiconductor element, that is, the optical semiconductor element and the semiconductor element are provided in a three-dimensional manner. With the arrangement in which the semiconductor element and the optical semiconductor element are arranged in parallel with each other, it is difficult to provide a great number of optical semiconductor elements on the circuit substrate due to the fact that the circuit substrate has a limited area. In contrast, with the above arrangement, the provision of the semiconductor elements does not decrease the area for the provision of the optical semiconductor elements. Therefore, it is possible to realize a semiconductor device in which a great number of optical semiconductor elements are provided.

Further, the semiconductor device of the present invention may further include: an interposer chip between the semiconductor element and said at least one optical semiconductor element.

According to the invention, it is possible to stack the optical semiconductor element above the semiconductor element via the interposer chip, regardless of (i) the size or number of the semiconductor elements, (ii) how the optical semiconductor element is contacted, and/or the like. Therefore, it is possible to realize a semiconductor device in which a great number of optical semiconductor elements are provided.

Further, in the semiconductor device of the present invention, (i) the circuit substrate may be constituted by a first circuit substrate on which said at least one optical semiconductor element is provided, and a second circuit substrate on which a semiconductor element other than said at least one optical semiconductor element is provided, the sealing resin may be constituted by a first sealing resin provided on the first circuit substrate, and a second sealing resin provided on the second circuit substrate, and the first circuit substrate may be provided above and is electrically connected to the second circuit substrate.

According to the invention, the first circuit substrate on which the optical semiconductor element is provided is provided on the second circuit substrate on which the semiconductor element other than the optical semiconductor element is provided, and is electrically connected to the second circuit substrate.

Therefore, it is possible to realize a semiconductor device in which an optimum optical semiconductor element is selected in accordance with (i) the size of the adopted semiconductor element, (ii) external electrodes, (iii) the size of a package of the semiconductor device, and/or the like.

In order to attain the object, a connector, provided at one end of an optical transmission member, connects the optical transmission member to a semiconductor device, the connector having an inner surface shape which extends in accordance with an outer shape of the sealing resin, and the one end of the optical transmission member facing said at least one optical semiconductor element in a case where the sealing resin is fitted into the connector.

With the arrangement, the connector has an inner surface shape which extends in accordance with the outer shape of the sealing resin. Therefore, the sealing resin of the semiconductor device can be fitted into the connector only when they are arranged in a certain direction. Further, in a case where the semiconductor device is fitted into the connector, the end of the optical transmission member and the optical semiconductor element are facing each other.

This (i) eliminates a possibility that the sealing resin is fitted into the connector while the end of the optical transmission member and the optical semiconductor element do not face each other, and (ii) realizes a secure and simple connection between the semiconductor device and the optical transmission member.

The connector of the present invention may include, a claw-shaped protrusion, provided on a side surface of the connector, for hooking and locking the circuit substrate.

According to the invention, the connector includes, a claw-shaped protrusion on a side surface of the connector, and a claw part of the claw-shaped protrusion hooks and locks a bottom surface of the circuit substrate when the semiconductor device is fitted into the connector. This can secure a more stable connection between the semiconductor device and the optical transmission member.

INDUSTRIAL APPLICABILITY

The present invention is applicable to not only a semiconductor device including an optical semiconductor element but also any semiconductor device which is required to be fitted into a connector in a certain direction.

REFERENCE SIGNS LIST

1. Circuit substrate
2. Semiconductor element
3. Optical semiconductor element
6. Transparent sealing resin (transparent sealing resin)
6a. Optical interface
7. Sealing resin
8. External electrode terminal
10. Cutout part (deformed part)
20. Semiconductor device
20a through 20j. Semiconductor devices
40. Connector
40a through 40g. Connectors
41. Claw-shaped protrusion
50. Optical fiber (optical transmission member)
100. Semiconductor device

The invention claimed is:

1. A semiconductor device comprising:
a circuit substrate;
a semiconductor element provided on the circuit substrate; and
a sealing resin, provided on the circuit substrate, with which the semiconductor element is sealed, the sealing resin having a cuboid shape or a cubic shape,
the sealing resin having an outer surface, the outer surface having at least one deformed part, wherein
a shape of the deformed part matches with a deformed part of a connector placed upon the outer surface of the sealing resin,
the deformed part is provided so that the outer surface, on which the deformed part is provided, loses its rotational symmetry,
the semiconductor element includes at least one optical semiconductor element,
said at least one optical semiconductor element is sealed with a transparent sealing resin,
the transparent sealing resin is exposed in the outer surface, and
the transparent sealing resin thus exposed constitutes a part of the deformed part.

2. The semiconductor device as set forth in claim 1, wherein:
the deformed part is a concave part recessed in a direction of a normal line of the outer surface of the sealing resin.

3. The semiconductor device as set forth in claim 2, wherein:
the concave part has a taper shape.

4. The semiconductor device as set forth in claim 1, wherein:
the deformed part is a protrusion part projected in a direction of a normal line of the outer surface of the sealing resin.

5. The semiconductor device as set forth in claim 4, wherein:
the protrusion part has a taper shape.

6. The semiconductor device according to claim 1, wherein the at least one deformed part is a single deformed part provided in the outer surface; and
the single deformed part is provided in an area other than a center area of the outer surface of the sealing resin.

7. The semiconductor device according to claim 1, wherein the at least one deformed part is a plurality of deformed parts provided in the outer surface; and
the plurality of deformed parts is provided so as not to be symmetric with respect to a central point on the outer surface.

* * * * *